US012706157B2

(12) United States Patent
Wang et al.

(10) Patent No.: US 12,706,157 B2
(45) Date of Patent: Aug. 11, 2026

(54) SUSPEND-RESUME-GO TECHNIQUES FOR MEMORY DEVICES

(71) Applicant: Sandisk Technologies, Inc., Milpitas, CA (US)

(72) Inventors: Yichen Wang, Shanghai (CN); Bruce Li, Shanghai (CN); Ming Wang, Shanghai (CN); Liang Li, Shanghai (CN)

(73) Assignee: Sandisk Technologies, Inc., Milpitas, CA (US)

( * ) Notice: Subject to any disclaimer, the term of this patent is extended or adjusted under 35 U.S.C. 154(b) by 164 days.

(21) Appl. No.: 18/677,632

(22) Filed: May 29, 2024

(65) Prior Publication Data

US 2025/0372175 A1 Dec. 4, 2025

(51) Int. Cl.
*G11C 16/04* (2006.01)
*G11C 16/16* (2006.01)
*G11C 16/34* (2006.01)

(52) U.S. Cl.
CPC .......... *G11C 16/16* (2013.01); *G11C 16/0483* (2013.01); *G11C 16/3445* (2013.01)

(58) Field of Classification Search
CPC .. G11C 16/16; G11C 16/0483; G11C 16/3445
USPC .................................................... 365/185.11
See application file for complete search history.

(56) References Cited

U.S. PATENT DOCUMENTS 10,115,466 B2 10/2018 Park et al.
11,557,358 B2 * 1/2023 Zhao .................. G11C 16/0483
11,749,351 B2 9/2023 Lee et al.
11,756,637 B2 9/2023 Ionin et al.
12,322,451 B2 * 6/2025 Shukla ................... G11C 16/16
2022/0415414 A1 12/2022 Moschiano et al.
2023/0317185 A1 10/2023 Bhat

* cited by examiner

*Primary Examiner* — Tha-O H Bui
(74) *Attorney, Agent, or Firm* — Dickinson Wright PLLC

(57) ABSTRACT

The memory device includes a memory block with an array of memory cells that are arranged in a plurality of word lines. The plurality of word lines includes a plurality of selected word lines that contain selected memory cells to be erased. The memory device also includes circuitry for erasing the selected memory cells in an erase operation. During the erase operation, the circuitry is configured to apply at least one erase pulse to the memory block to erase the selected memory cells. The circuitry is also configured to suspend the at least one erase pulse for a suspend duration. After the suspend duration and before applying a next erase pulse to the memory block, the circuitry is configured to perform an erase-verify operation on only a portion of the selected memory cells.

20 Claims, 22 Drawing Sheets

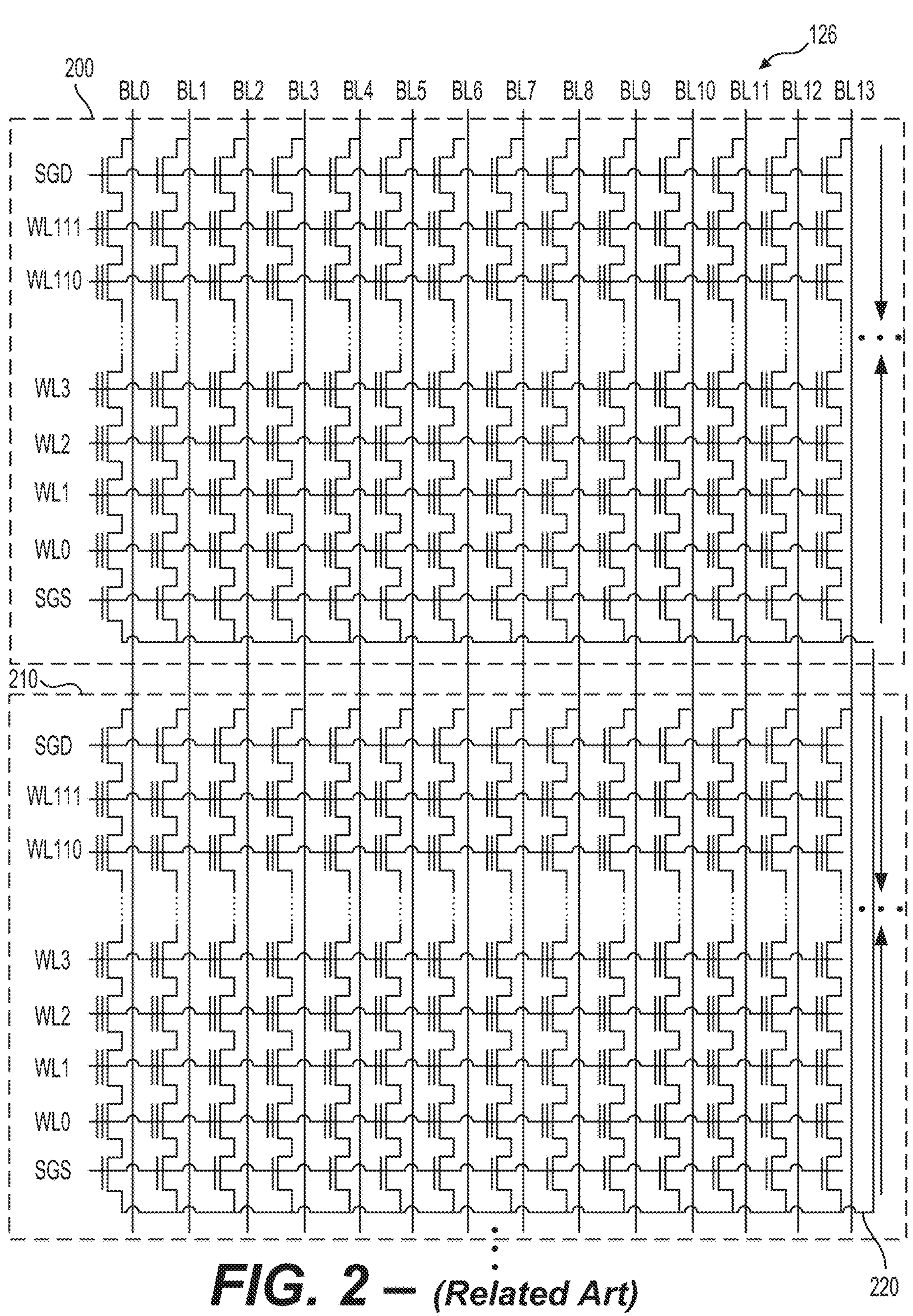
FIG. 2 — (Related Art)

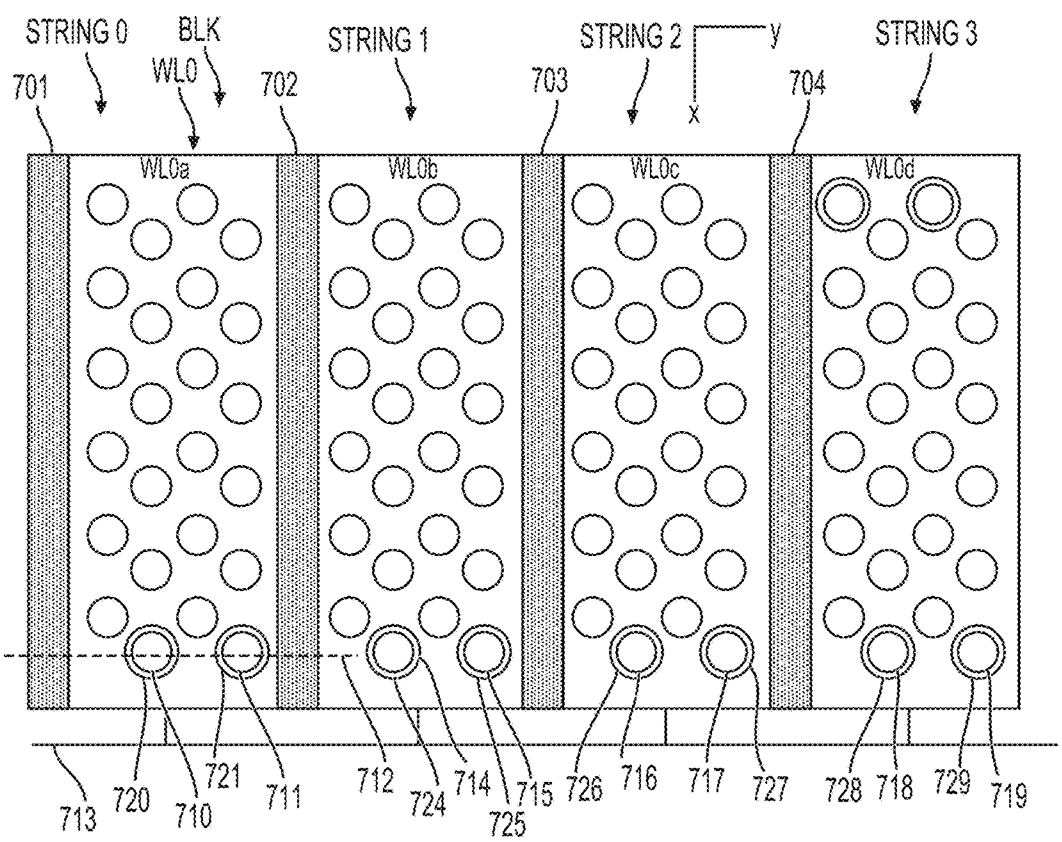
FIG. 7A – (Related Art)
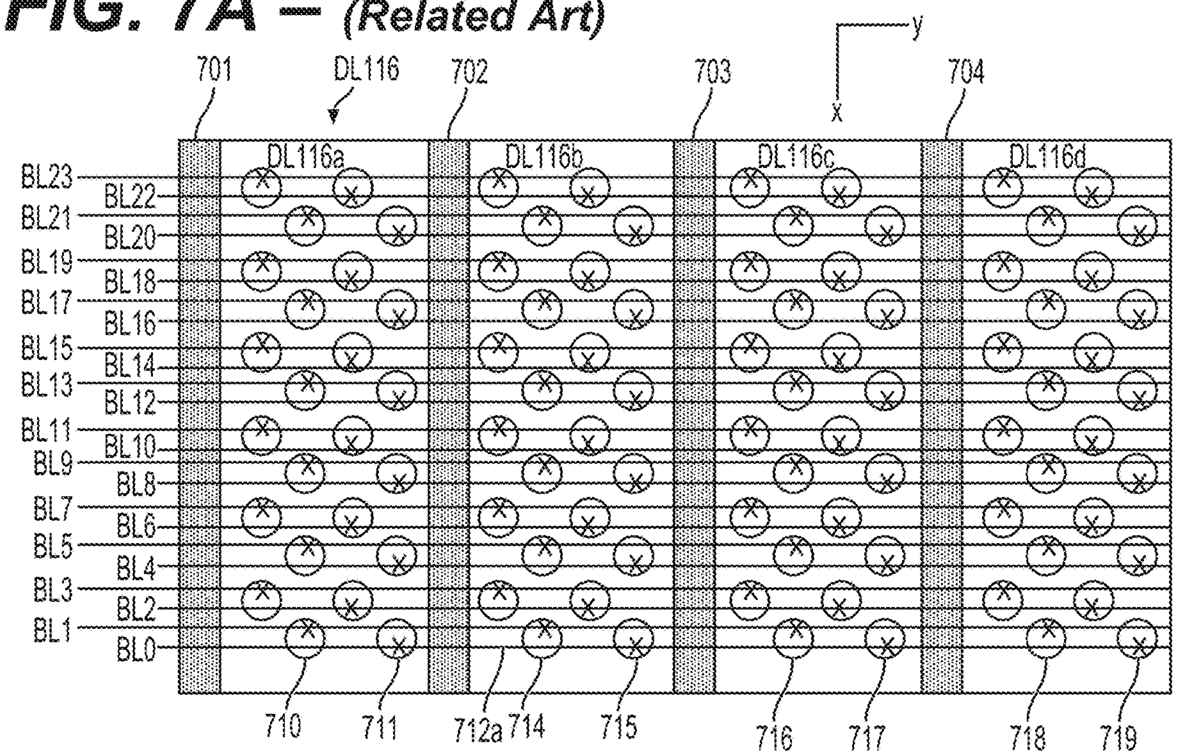
FIG. 7B - (Related Art)

1200
BEGIN ERASE OPERATION
1202
APPLY ERASE PULSE(S)
1204
SUSPEND ERASE OPERATION
1206
VERIFY STRING 0
1208
DID STRING 0 PASS VERIFY?
YES
NO
1210
VERIFY STRINGS 1/2/3
1212
DID STRINGS 1/2/3 PASS VERIFY?
YES
NO
1216
DETERMINE NEXT ERASE PULSE DURATION
1218
APPLY ERASE PULSE
1220
VERIFY STRING 0/1/2/3
1222
DID ALL STRINGS PASS VERIFY?
YES
NO
1224
HAS MAX LOOPS BEEN REACHED?
YES
NO
1226
ERASE FAIL
1214
ERASE PASS

| CONDITION | STRING 0 ERASE - VERIFY | COMPARE COUNT TO THRESHOLD | ERASE PULSE DURATION |
|---|---|---|---|
| 1 | FAIL | COUNT > THRESHOLD | E_TIME + DELTA 1 |
| 2 | FAIL | 0 < COUNT < THRESHOLD | E_TIME + DELTA 2 |
| 3 | PASS | N/A | E_TIME + DELTA 3 |

FIG. 13

SUSPEND-RESUME-GO TECHNIQUES FOR MEMORY DEVICES

BACKGROUND

1. Field

The subject disclosure is related generally to techniques for erasing memory cells in a memory device and, more particularly, to techniques for improving the erasing of the memory cells after a suspension occurs.

2. Related Art

Semiconductor memory is widely used in various electronic devices, such as cellular telephones, digital cameras, personal digital assistants, medical electronics, mobile computing devices, servers, solid state drives, non-mobile computing devices and other devices. Semiconductor memory may comprise non-volatile memory or volatile memory. A non-volatile memory allows information to be stored and retained even when the non-volatile memory is not connected to a source of power, e.g., a battery.

NAND memory devices include a chip with a plurality of memory blocks, each of which includes an array of memory cells arranged in a plurality of word lines. The memory cells can be programmed to hold respective threshold voltages Vt that are associated with different programmed data states. However, when data is no longer needed and it is desired to program new data into the memory cells, those memory cells must first be erased to lower their threshold voltages Vt below a certain level. An erase operation typically includes a plurality of erase loops, each with an erase pulse and an erase-verify operation. Sometimes, during an erase operation, a host receive an instruction to perform a higher priority operation, such as reading data in a different memory block. Conventional responses to suspension events occasionally lead to over-erase.

SUMMARY

One aspect of the present disclosure is related to a method of performing an erase operation in a memory device. The method includes the step of preparing a memory block that includes an array of memory cells that are arranged in a plurality of word lines. The method continues with the step of applying at least one erase pulse to the memory block to erase the memory cells of a plurality of selected word lines of the plurality of word lines. The plurality of selected word lines include a plurality of selected memory cells. The method proceeds with the step of suspending the at least one erase pulse for a suspend duration. After the suspend duration and before applying a next erase pulse to the memory block, performing an erase-verify operation on only a portion of the selected memory cells.

According to another aspect of the present disclosure, during the step of performing the erase-verify operation on only the portion of the selected memory cells, the method further includes the step of counting the number of memory cells that fail the erase-verify operation to establish a count. The method proceeds with the step of determining an erase pulse duration for the next erase pulse as a function of the count.

According to yet another aspect of the present disclosure, the step of determining the erase pulse duration for the next erase pulse as a function of the count includes the step of comparing the count to a predetermined threshold. The method proceeds with the step of setting the erase pulse duration at a first timeframe in response to the count being above the predetermined threshold. The method continues with the step of setting the erase pulse duration at a second timeframe in response to the count being below the predetermined threshold, and wherein the second timeframe is less than the first timeframe.

According to still another aspect of the present disclosure, the portion of selected memory cells includes the memory cells of a single string of a plurality of strings in the memory block. In response to the single string of memory block passing the erase-verify operation, then the method further includes the step of verifying the remaining strings of the memory block.

According to a further aspect of the present disclosure, in response to any of the remaining strings of the memory block failing the erase-verify operation, then the method further includes the step of setting the erase pulse duration at a third timeframe that is less than the second timeframe.

According to yet a further aspect of the present disclosure, the portion of selected memory cells includes the memory cells of a single string of a plurality of strings in the memory block.

According to still a further aspect of the present disclosure, the plurality of selected word lines include all of the data word lines in the memory block.

Another aspect of the present disclosure is related to a memory device that includes a memory block with an array of memory cells that are arranged in a plurality of word lines. The plurality of word lines includes a plurality of selected word lines that contain selected memory cells to be erased. The memory device also includes circuitry for erasing the selected memory cells in an erase operation. During the erase operation, the circuitry is configured to apply at least one erase pulse to the memory block to erase the selected memory cells. The circuitry is also configured to suspend the at least one erase pulse for a suspend duration. After the suspend duration and before applying a next erase pulse to the memory block, the circuitry is configured to perform an erase-verify operation on only a portion of the selected memory cells.

According to another aspect of the present disclosure, during the step of performing the erase-verify operation on only the portion of the selected memory cells, the circuitry counts the number of memory cells that fail the erase-verify operation to establish a count and determines an erase pulse duration for the next erase pulse as a function of the count.

According to yet another aspect of the present disclosure, while determining the erase pulse duration for the next erase pulse as a function of the count, the circuitry compares the count to a predetermined threshold. The circuitry then sets the erase pulse duration at a first timeframe in response to the count being above the predetermined threshold and sets the erase pulse duration at a second timeframe in response to the count being below the predetermined threshold, and wherein the second timeframe is less than the first timeframe.

According to still another aspect of the present disclosure, the portion of selected memory cells includes the memory cells of a single string of a plurality of strings in the memory block. In response to the single string of memory block passing the erase-verify operation, then the circuitry verifies the remaining strings of the memory block.

According to a further aspect of the present disclosure, in response to any of the remaining strings of the memory block failing the erase-verify operation, then the circuitry sets the erase pulse duration at a third timeframe that is less than the second timeframe.

According to yet a further aspect of the present disclosure, the portion of selected memory cells includes the memory cells of a single string of a plurality of strings in the memory block.

According to still a further aspect of the present disclosure, the plurality of selected word lines include all of the data word lines in the memory block.

Yet another aspect of the present disclosure is related to an apparatus that includes a memory block with an array of memory cells that are arranged in a plurality of word lines. The plurality of word lines includes a plurality of selected word lines containing selected memory cells to be erased. The apparatus also includes an erasing means for erasing the selected memory cells in an erase operation. During the erase operation, the erasing means is configured to apply at least one erase pulse to the memory block to erase the selected memory cells. The erasing means then suspends the at least one erase pulse for a suspend duration. After the suspend duration and before applying a next erase pulse to the memory block, the erasing means performs an erase-verify operation on only a portion of the selected memory cells.

According to another aspect of the present disclosure, while performing the erase-verify operation on only the portion of the selected memory cells, the erasing means counts the number of memory cells that fail the erase-verify operation to establish a count and determines an erase pulse duration for the next erase pulse as a function of the count.

According to yet another aspect of the present disclosure, while determining the erase pulse duration for the next erase pulse as a function of the count, the erasing means compares the count to a predetermined threshold. The erasing means then sets the erase pulse duration at a first timeframe in response to the count being above the predetermined threshold and sets the erase pulse duration at a second timeframe in response to the count being below the predetermined threshold, and wherein the second timeframe is less than the first timeframe.

According to still another aspect of the present disclosure, the portion of selected memory cells includes the memory cells of a single string of a plurality of strings in the memory block. In response to the single string of memory block passing the erase-verify operation, then the erasing means verifies the remaining strings of the memory block.

According to a further aspect of the present disclosure, in response to any of the remaining strings of the memory block failing the erase-verify operation, then the erasing means sets the erase pulse duration at a third timeframe that is less than the second timeframe.

According to yet a further aspect of the present disclosure, the portion of selected memory cells includes the memory cells of a single string of a plurality of strings in the memory block.

BRIEF DESCRIPTION OF THE DRAWINGS

A more detailed description is set forth below with reference to example embodiments depicted in the appended figures. Understanding that these figures depict only example embodiments of the disclosure and are, therefore, not to be considered limiting of its scope. The disclosure is described and explained with added specificity and detail through the use of the accompanying drawings in which:

FIG. 2 depicts blocks of memory cells in an example two-dimensional configuration of the memory array of FIG. 1A;

FIG. 7A depicts a top view of an example word line layer WL0 of the stack of FIG. 6B;

FIG. 7B depicts a top view of an example top dielectric layer DL116 of the stack of FIG. 6B;

FIG. 13 is an exemplary look up table for use during the erase operation depicted in FIG. 12;

DESCRIPTION OF THE ENABLING EMBODIMENTS

The present disclosure is related to erasing techniques which reduce the risk of over-erase occurring following a suspension event during an erase operation. According to these techniques, immediately after the suspension event, an erase-verify operation is performed on only a portion of the memory cells (for example, one string) of a selected memory block or sub-block being erased. If the erase-verify operation passes, then an erase-verify operation is performed on the remaining memory cells of the selected memory block or sub-block to determine if the erase operation is complete. If the erase-verify operation fails, then an erase pulse duration for a next erase pulse is dynamically set as a function of a count of failed bits.

Figures 1A, 1B:
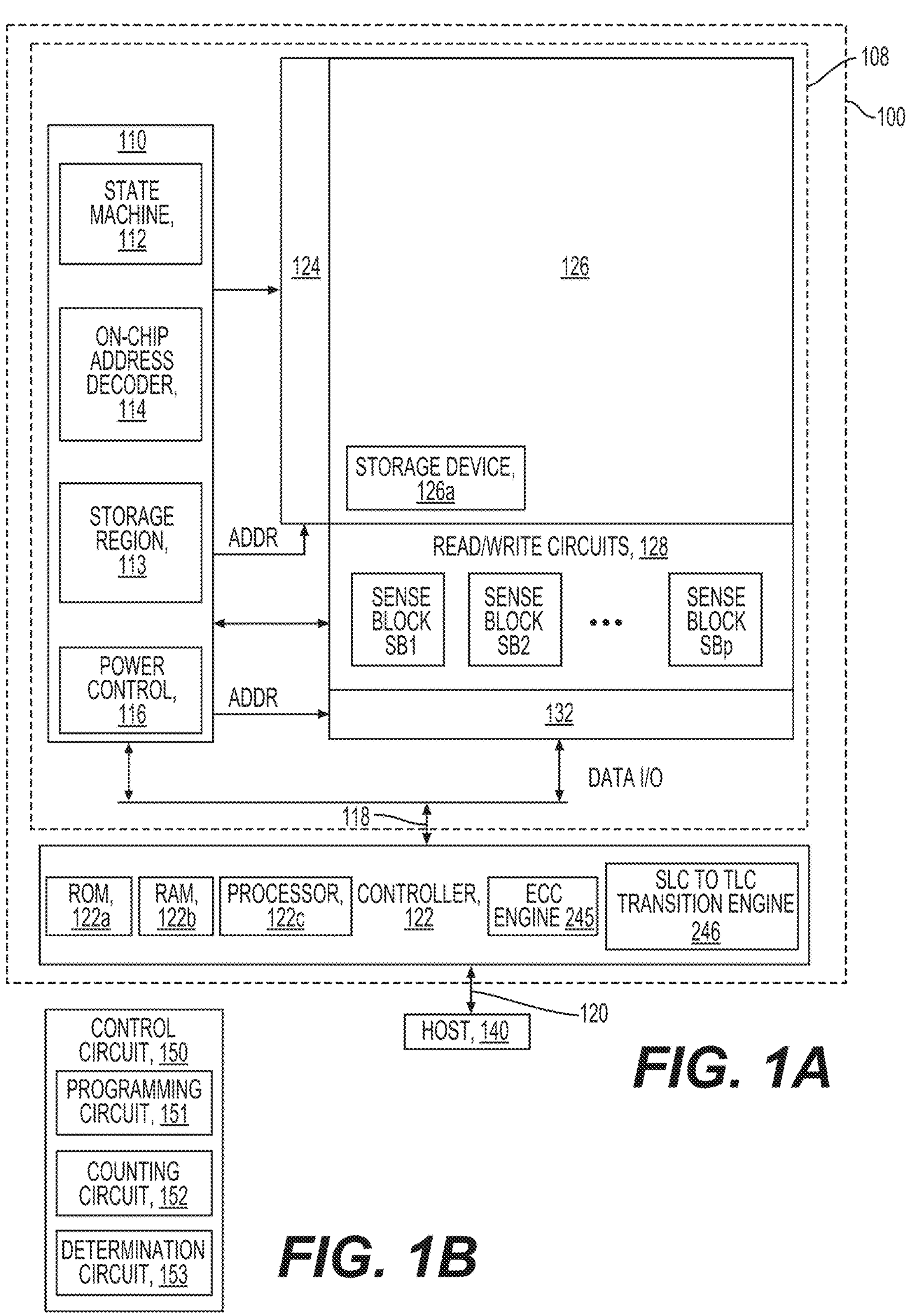
FIG. 1A is a block diagram of an example memory device.
FIG. 1B is a block diagram of an example control circuit.

FIG. 1A is a block diagram of an example memory device 100 that is configured to erase the memory cells of a selected memory block or sub-block according to the erase techniques of the subject disclosure. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks SB1, SB2, . . . . SBp (sensing circuitry) and allow a page of memory cells to be read or programmed in parallel. Typically, a controller 122 is included in the same memory device 100 (e.g., a removable storage card) as the one or more memory die 108. Commands and data are transferred between the host 140 and controller 122 via a data bus 120, and between the controller and the one or more memory die 108 via lines 118.

The memory structure 126 can be two-dimensional or three-dimensional. The memory structure 126 may comprise one or more array of memory cells including a three-dimensional array. The memory structure 126 may comprise a monolithic three-dimensional memory structure in which multiple memory levels are formed above (and not in) a single substrate, such as a wafer, with no intervening substrates. The memory structure 126 may comprise any type of non-volatile memory that is monolithically formed in one or more physical levels of arrays of memory cells having an active area disposed above a silicon substrate. The memory structure 126 may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, and a power control module 116. The state machine 112 provides chip-level control of memory operations.

A storage region 113 may, for example, be provided for programming parameters. The programming parameters may include a program voltage, a program voltage bias, position parameters indicating positions of memory cells, contact line connector thickness parameters, a verify voltage, and/or the like. The position parameters may indicate a position of a memory cell within the entire array of NAND strings, a position of a memory cell as being within a particular NAND string group, a position of a memory cell on a particular plane, and/or the like. The contact line connector thickness parameters may indicate a thickness of a contact line connector, a substrate or material that the contact line connector is comprised of, and/or the like.

The on-chip address decoder 114 provides an address interface between that used by the host or a memory controller to the hardware address used by the decoders 124 and 132. The power control module 116 controls the power and voltages supplied to the word lines and bit lines during memory operations. It can include drivers for word lines, SGS and SGD transistors, and source lines. The sense blocks can include bit line drivers, in one approach. An SGS transistor is a select gate transistor at a source end of a NAND string, and an SGD transistor is a select gate transistor at a drain end of a NAND string.

In some embodiments, some of the components can be combined. In various designs, one or more of the components (alone or in combination), other than memory structure 126, can be thought of as at least one control circuit which is configured to perform the actions described herein. For example, a control circuit may include any one of, or a combination of, control circuitry 110, state machine 112, decoders 114/132, power control module 116, sense blocks SBb, SB2, . . . , SBp, read/write circuits 128, controller 122, and so forth.

The control circuits 150 can include a programming circuit 151 configured to perform a program and verify operation for one set of memory cells, wherein the one set of memory cells comprises memory cells assigned to represent one data state among a plurality of data states and memory cells assigned to represent another data state among the plurality of data states; the program and verify operation comprising a plurality of program and verify iterations; and in each program and verify iteration, the programming circuit performs programming for the one selected word line after which the programming circuit applies a verification signal to the selected word line. The control circuits 150 can also include a counting circuit 152 configured to obtain a count of memory cells which pass a verify test for the one data state. The control circuits 150 can also include a determination circuit 153 configured to determine, based on an amount by which the count exceeds a threshold, if a programming operation is completed.

For example, FIG. 1B is a block diagram of an example control circuit 150 which comprises the programming circuit 151, the counting circuit 152, and the determination circuit 153.

The off-chip controller 122 may comprise a processor 122*c*, storage devices (memory) such as ROM 122*a* and RAM 122*b*, an error-correction code (ECC) engine 245, and a suspend-resume-go (SRG) engine 246. The ECC engine can correct a number of read errors which are caused when the upper tail of a Vt distribution becomes too high. However, uncorrectable errors may exist in some cases. The techniques provided herein reduce the likelihood of uncorrectable errors. The SRG engine 246 can perform the erase techniques discussed in further detail below.

The storage device(s) 122*a*, 122*b* comprise, code such as a set of instructions, and the processor 122*c* is operable to execute the set of instructions to provide the functionality described herein. Alternately or additionally, the processor 122*c* can access code from a storage device 126*a* of the memory structure 126, such as a reserved area of memory cells in one or more word lines. For example, code can be used by the controller 122 to access the memory structure 126 such as for programming, read and erase operations. The code can include boot code and control code (e.g., set of instructions). The boot code is software that initializes the controller 122 during a booting or startup process and enables the controller 122 to access the memory structure 126. The code can be used by the controller 122 to control one or more memory structures 126. Upon being powered up, the processor 122*c* fetches the boot code from the ROM 122*a* or storage device 126*a* for execution, and the boot code initializes the system components and loads the control code into the RAM 122*b*. Once the control code is loaded into the RAM 122*b*, it is executed by the processor 122*c*. The control code includes drivers to perform basic tasks such as controlling and allocating memory, prioritizing the processing of instructions, and controlling input and output ports.

Figure 1C:
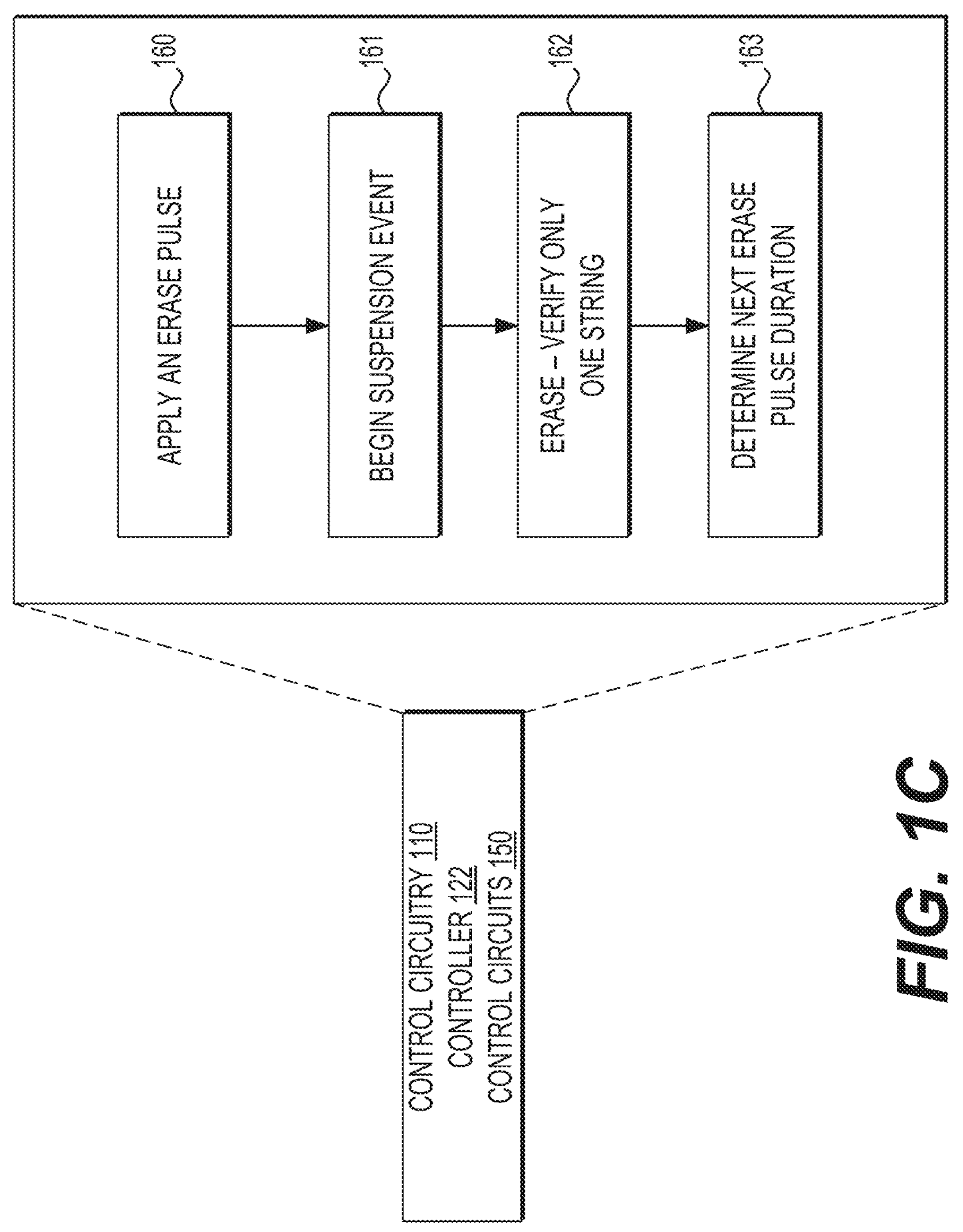
FIG. 1C is a block diagram of example circuitry of the memory device of FIG. 1A.

Generally, the control code can include instructions to perform the functions described herein including the steps of the flowcharts discussed further below and provide the voltage waveforms including those discussed further below. For example, as illustrated in FIG. 1C, the control circuitry 110, controller 122, control circuits 150, and/or any other circuitry are configured/programmed, during an erase operation, at step 160 to apply an erase pulse to a selected memory block or sub-block. At step 161, an instruction is received to begin a suspension event. The suspension event could be, for example, the memory device performing a read operation in another memory block. At step 162, immediately after the suspension event (before a next erase pulse), an erase-verify operation is performed on only a single string of the selected memory block. At step 163, an erase pulse duration for a next erase pulse is determined as a function of the erase-verify operation that is performed on only the single string of the selected memory block. For example, if the erase-verify operation determines that the erase operation is nearly completed, then the erase pulse duration is set at a very low level. On the other hand, if the erase-verify operation determines that a lot more erasing remains to be done, then the erase pulse duration is set at a relatively higher level.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple memory strings in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured. The semiconductor memory elements located within and/or over a substrate may be arranged in two or three dimensions, such as a two-dimensional memory structure or a three-dimensional memory structure.

In a two-dimensional memory structure, the semiconductor memory elements are arranged in a single plane or a single memory device level. Typically, in a two-dimensional memory structure, memory elements are arranged in a plane (e.g., in an x-y direction plane) which extends substantially parallel to a major surface of a substrate that supports the memory elements. The substrate may be a wafer over or in which the layer of the memory elements is formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three-dimensional memory array is arranged so that memory elements occupy multiple planes or multiple memory device levels, thereby forming a structure in three dimensions (i.e., in the x, y and z directions, where the z-direction is substantially perpendicular and the x- and y-directions are substantially parallel to the major surface of the substrate).

As a non-limiting example, a three-dimensional memory structure may be vertically arranged as a stack of multiple two-dimensional memory device levels. As another non-limiting example, a three-dimensional memory array may be arranged as multiple vertical columns (e.g., columns extending substantially perpendicular to the major surface of the substrate, i.e., in the y direction) with each column having multiple memory elements. The columns may be arranged in a two-dimensional configuration, e.g., in an x-y plane, resulting in a three-dimensional arrangement of memory elements with elements on multiple vertically stacked memory planes. Other configurations of memory elements in three dimensions can also constitute a three-dimensional memory array.

By way of non-limiting example, in a three-dimensional array of NAND strings, the memory elements may be coupled together to form a NAND string within a single horizontal (e.g., x-y) memory device level. Alternatively, the memory elements may be coupled together to form a vertical NAND string that traverses across multiple horizontal memory device levels. Other three-dimensional configurations can be envisioned wherein some NAND strings contain memory elements in a single memory level while other strings contain memory elements which span through multiple memory levels. Three-dimensional memory arrays may also be designed in a NOR configuration and in a ReRAM configuration.

Typically, in a monolithic three-dimensional memory array, one or more memory device levels are formed above a single substrate. Optionally, the monolithic three-dimensional memory array may also have one or more memory layers at least partially within the single substrate. As a non-limiting example, the substrate may include a semiconductor such as silicon. In a monolithic three-dimensional array, the layers constituting each memory device level of the array are typically formed on the layers of the underlying memory device levels of the array. However, layers of adjacent memory device levels of a monolithic three-dimensional memory array may be shared or have intervening layers between memory device levels.

Then again, two-dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three-dimensional memory arrays. Further, multiple two-dimensional memory arrays or three-dimensional memory arrays (monolithic or non-monolithic) may be formed on separate chips and then packaged together to form a stacked-chip memory device.

FIG. 2 illustrates memory blocks 200, 210 of memory cells in an example two-dimensional configuration of the memory array 126 of FIG. 1. The memory array 126 can include many such blocks 200, 210. Each example block 200, 210 includes a number of NAND strings and respective bit lines, e.g., BL0, BL1, . . . which are shared among the blocks. Each NAND string is connected at one end to a drain-side select gate (SGD), and the control gates of the drain-side select gates are connected via a common SGD line. The NAND strings are connected at their other end to a source-side select gate (SGS) which, in turn, is connected to a common source line 220. One hundred and twelve word lines, for example, WL0-WL111, extend between the SGSs and the SGDs. In some embodiments, the memory block may include more or fewer than one hundred and twelve word lines. For example, in some embodiments, a memory block includes one hundred and sixty-four word lines. In some cases, dummy word lines, which contain no user data, can also be used in the memory array adjacent to the select gate transistors or between certain data word lines. Such dummy word lines can shield the edge data word line from certain edge effects.

Figure 3A:
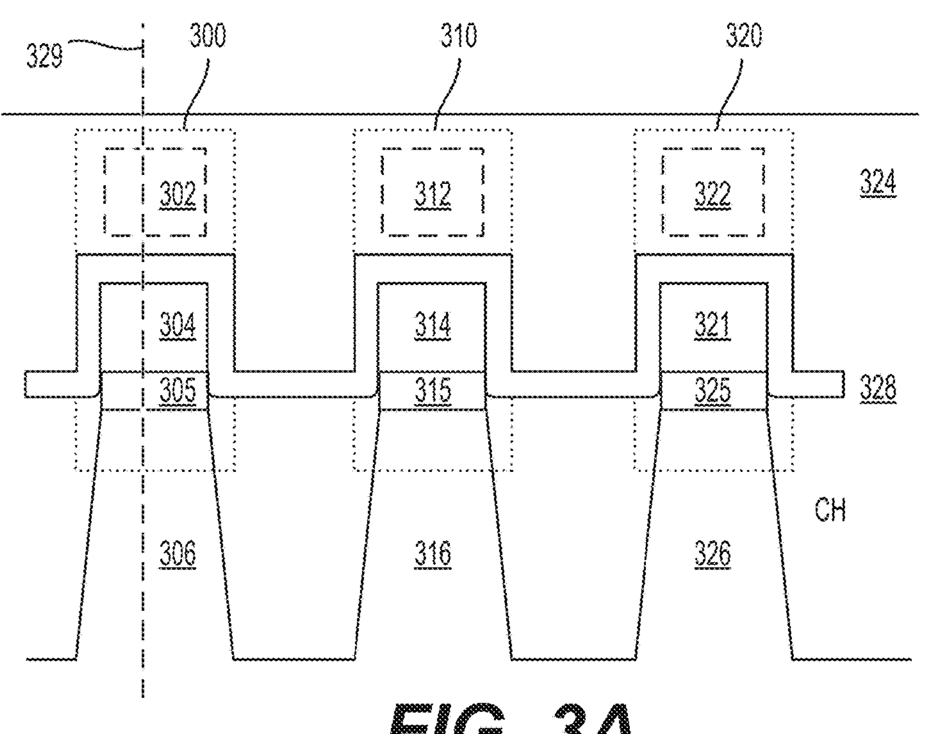
FIG. 3A and FIG. 3B depict cross-sectional views of example floating gate memory cells in NAND strings.
Figure 3B:
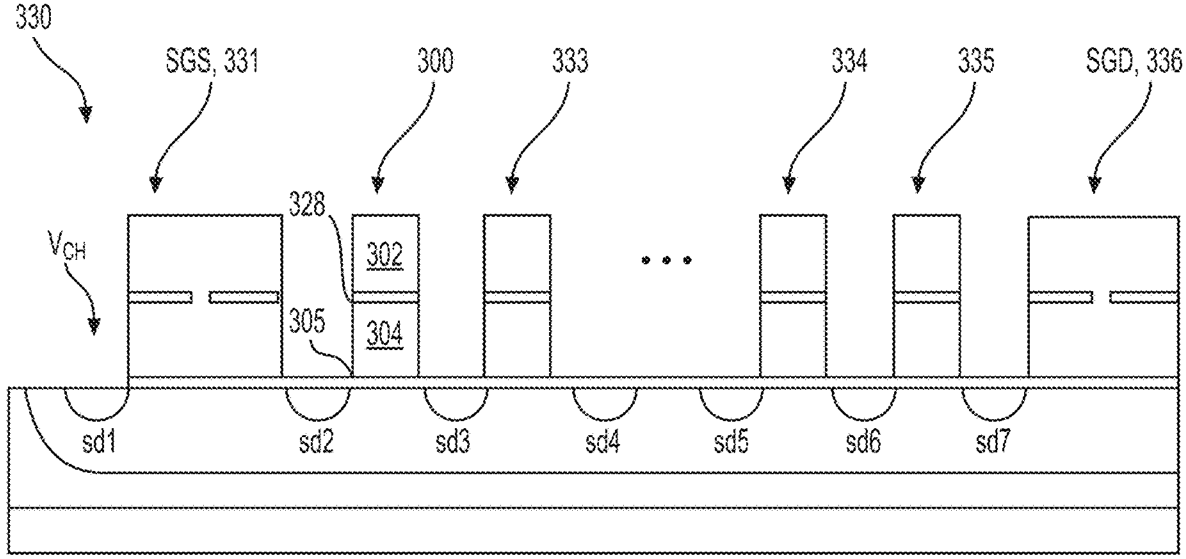

One type of non-volatile memory which may be provided in the memory array is a floating gate memory, such as of the type shown in FIGS. 3A and 3B. However, other types of non-volatile memory can also be used. As discussed in further detail below, in another example shown in FIGS. 4A and 4B, a charge-trapping memory cell uses a non-conductive dielectric material in place of a conductive floating gate to store charge in a non-volatile manner. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. A similar cell can be provided in a split-gate configuration where a doped polysilicon gate extends over a portion of the memory cell channel to form a separate select transistor.

In another approach, NROM cells are used. Two bits, for example, are stored in each NROM cell, where an ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric. Other types of non-volatile memory are also known.

FIG. 3A illustrates a cross-sectional view of example floating gate memory cells 300, 310, 320 in NAND strings. In this Figure, a bit line or NAND string direction goes into the page, and a word line direction goes from left to right. As an example, word line 324 extends across NAND strings which include respective channel regions 306, 316 and 326. The memory cell 300 includes a control gate 302, a floating gate 304, a tunnel oxide layer 305 and the channel region 306. The memory cell 310 includes a control gate 312, a floating gate 314, a tunnel oxide layer 315 and the channel region 316. The memory cell 320 includes a control gate 322, a floating gate 321, a tunnel oxide layer 325 and the channel region 326. Each memory cell 300, 310, 320 is in a different respective NAND string. An inter-poly dielectric (IPD) layer 328 is also illustrated. The control gates 302, 312, 322 are portions of the word line. A cross-sectional view along contact line connector 329 is provided in FIG. 3B.

The control gate 302, 312, 322 wraps around the floating gate 304, 314, 321, increasing the surface contact area between the control gate 302, 312, 322 and floating gate 304, 314, 321. This results in higher IPD capacitance, leading to a higher coupling ratio which makes programming and erase easier. However, as NAND memory devices are scaled down, the spacing between neighboring cells 300, 310, 320 becomes smaller so there is almost no space for the control gate 302, 312, 322 and the IPD layer 328 between two adjacent floating gates 302, 312, 322.

Figure 4A:
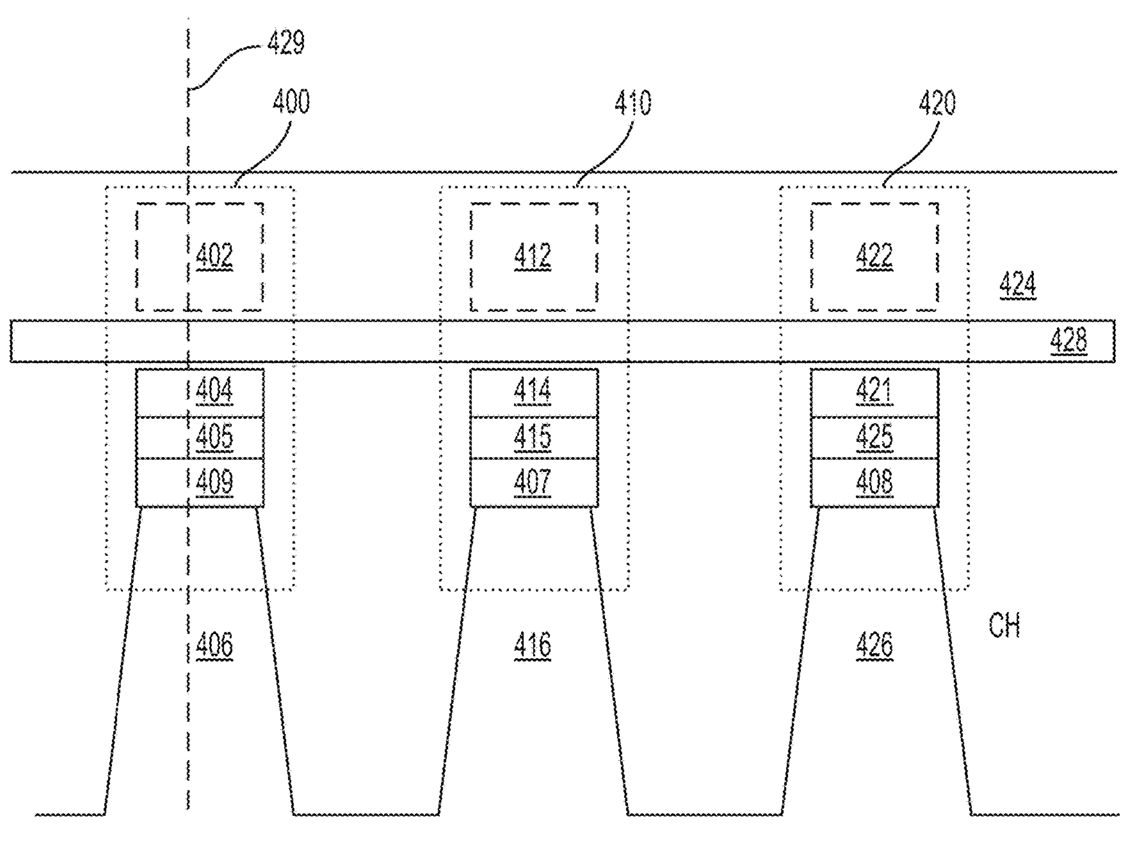
FIG. 4A and FIG. 4B depict cross-sectional views of example charge-trapping memory cells in NAND strings.
Figure 4B:
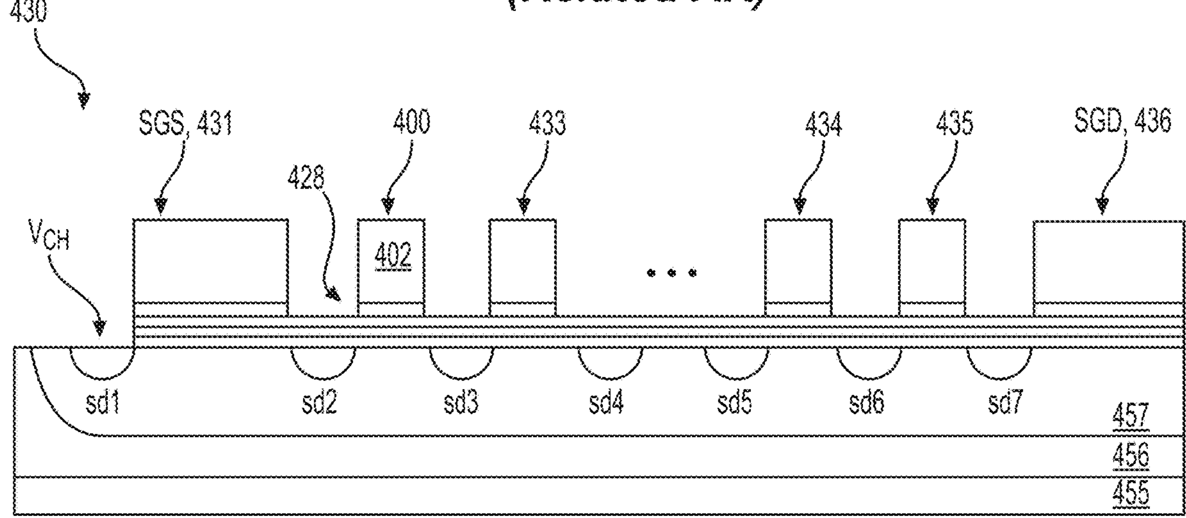

As an alternative, as shown in FIGS. 4A and 4B, the flat or planar memory cell 400, 410, 420 has been developed in which the control gate 402, 412, 422 is flat or planar; that is, it does not wrap around the floating gate and its only contact with the charge storage layer 428 is from above it. In this case, there is no advantage in having a tall floating gate. Instead, the floating gate is made much thinner. Further, the floating gate can be used to store charge, or a thin charge trap layer can be used to trap charge. This approach can avoid the issue of ballistic electron transport, where an electron can travel through the floating gate after tunneling through the tunnel oxide during programming.

FIG. 4A depicts a cross-sectional view of example charge-trapping memory cells 400, 410, 420 in NAND strings. The view is in a word line direction of memory cells 400, 410, 420 comprising a flat control gate and charge-trapping regions as a two-dimensional example of memory cells 400, 410, 420 in the memory cell array 126 of FIG. 1. Charge-trapping memory can be used in NOR and NAND flash memory device. This technology uses an insulator such as an SiN film to store electrons, in contrast to a floating-gate MOSFET technology which uses a conductor such as doped polycrystalline silicon to store electrons. As an example, a word line 424 extends across NAND strings which include respective channel regions 406, 416, 426. Portions of the word line provide control gates 402, 412, 422. Below the word line is an IPD layer 428, charge-trapping layers 404, 414, 421, polysilicon layers 405, 415, 425, and tunneling layers 409, 407, 408. Each charge-trapping layer 404, 414, 421 extends continuously in a respective NAND string. The flat configuration of the control gate can be made thinner than a floating gate. Additionally, the memory cells can be placed closer together.

FIG. 4B illustrates a cross-sectional view of the structure of FIG. 4A along contact line connector 429. The NAND string 430 includes an SGS transistor 431, example memory cells 400, 433, . . . 435, and an SGD transistor 436. Passageways in the IPD layer 428 in the SGS and SGD transistors 431, 436 allow the control gate layers 402 and floating gate layers to communicate. The control gate 402 and floating gate layers may be polysilicon and the tunnel oxide layer may be silicon oxide, for instance. The IPD layer 428 can be a stack of nitrides (N) and oxides (O) such as in a N-O-N-O-N configuration.

The NAND string may be formed on a substrate which comprises a p-type substrate region 455, an n-type well 456 and a p-type well 457. N-type source/drain diffusion regions sd1, sd2, sd3, sd4, sd5, sd6 and sd7 are formed in the p-type well. A channel voltage, Vch, may be applied directly to the channel region of the substrate.

Figure 5:
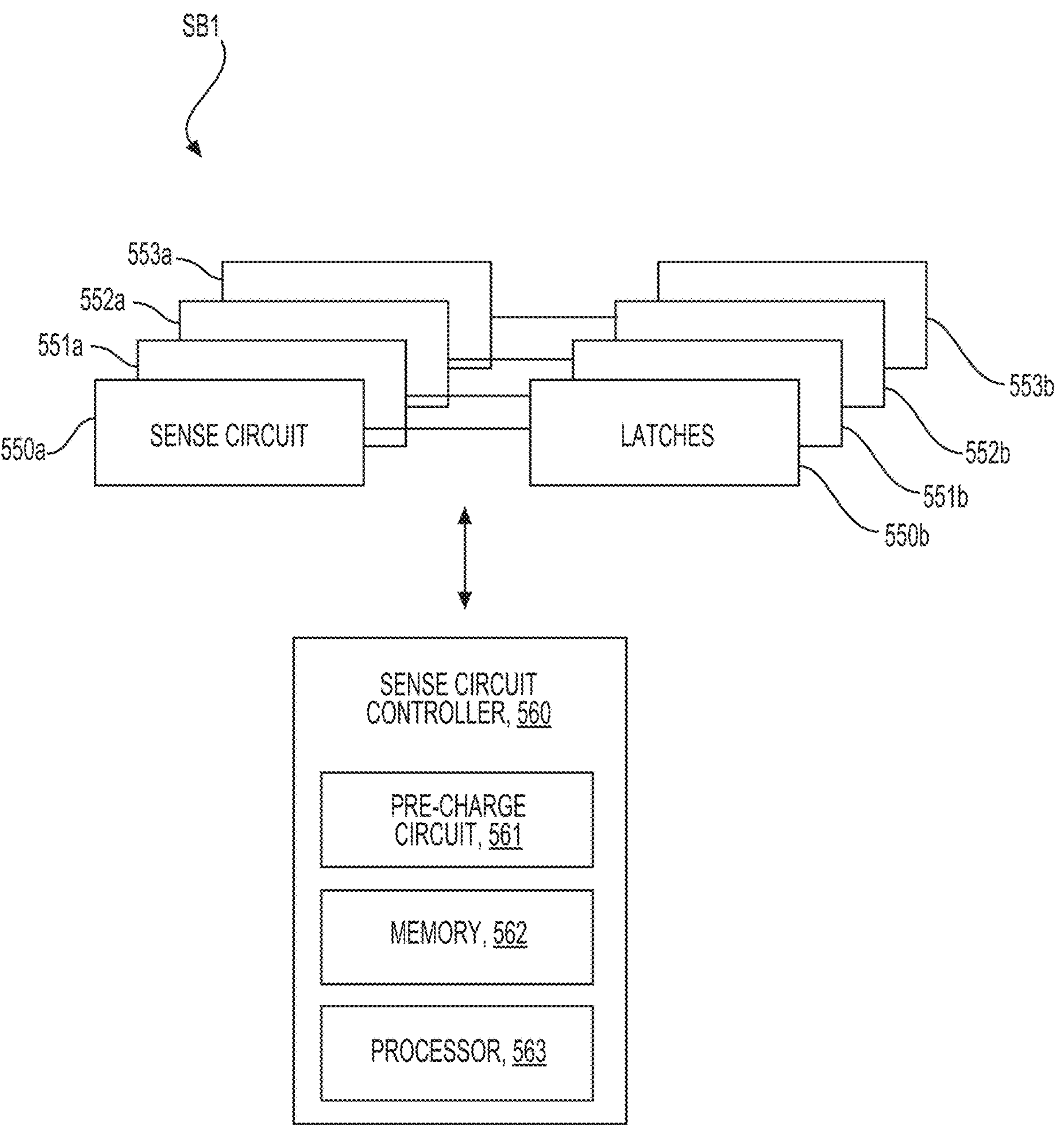
FIG. 5 depicts an example block diagram of the sense block SB1 of FIG. 1.

FIG. 5 illustrates an example block diagram of the sense block SB1 of FIG. 1. In one approach, a sense block comprises multiple sense circuits. Each sense circuit is associated with data latches. For example, the example sense circuits 550*a*, 551*a*, 552*a*, and 553*a* are associated with the data latches 550*b*, 551*b*, 552*b*, and 553*b*, respectively. In one approach, different subsets of bit lines can be sensed using different respective sense blocks. This allows the processing load which is associated with the sense circuits to be divided up and handled by a respective processor in each sense block. For example, a sense circuit controller 560 in SB1 can communicate with the set of sense circuits and latches. The sense circuit controller 560 may include a pre-charge circuit 561 which provides a voltage to each sense circuit for setting a pre-charge voltage. In one possible approach, the voltage is provided to each sense circuit independently, e.g., via the data bus and a local bus. In another possible approach, a common voltage is provided to each sense circuit concurrently. The sense circuit controller 560 may also include a pre-charge circuit 561, a memory 562 and a processor 563. The memory 562 may store code which is executable by the processor to perform the functions described herein. These functions can include reading the latches 550*b*, 551*b*, 552*b*, 553*b* which are associated with the sense circuits 550*a*, 551*a*, 552*a*, 553*a*, setting bit values in the latches and providing voltages for setting pre-charge levels in sense nodes of the sense circuits 550*a*, 551*a*, 552*a*, 553*a*. Further example details of the sense circuit controller 560 and the sense circuits 550*a*, 551*a*, 552*a*, 553*a* are provided below.

In some embodiments, a memory cell may include a flag register that includes a set of latches storing flag bits. In some embodiments, a quantity of flag registers may correspond to a quantity of data states. In some embodiments, one or more flag registers may be used to control a type of verification technique used when verifying memory cells. In some embodiments, a flag bit's output may modify associated logic of the device, e.g., address decoding circuitry, such that a specified block of cells is selected. A bulk operation (e.g., an erase operation, etc.) may be carried out using the flags set in the flag register, or a combination of the flag register with the address register, as in implied addressing, or alternatively by straight addressing with the address register alone.

Figure 6A:
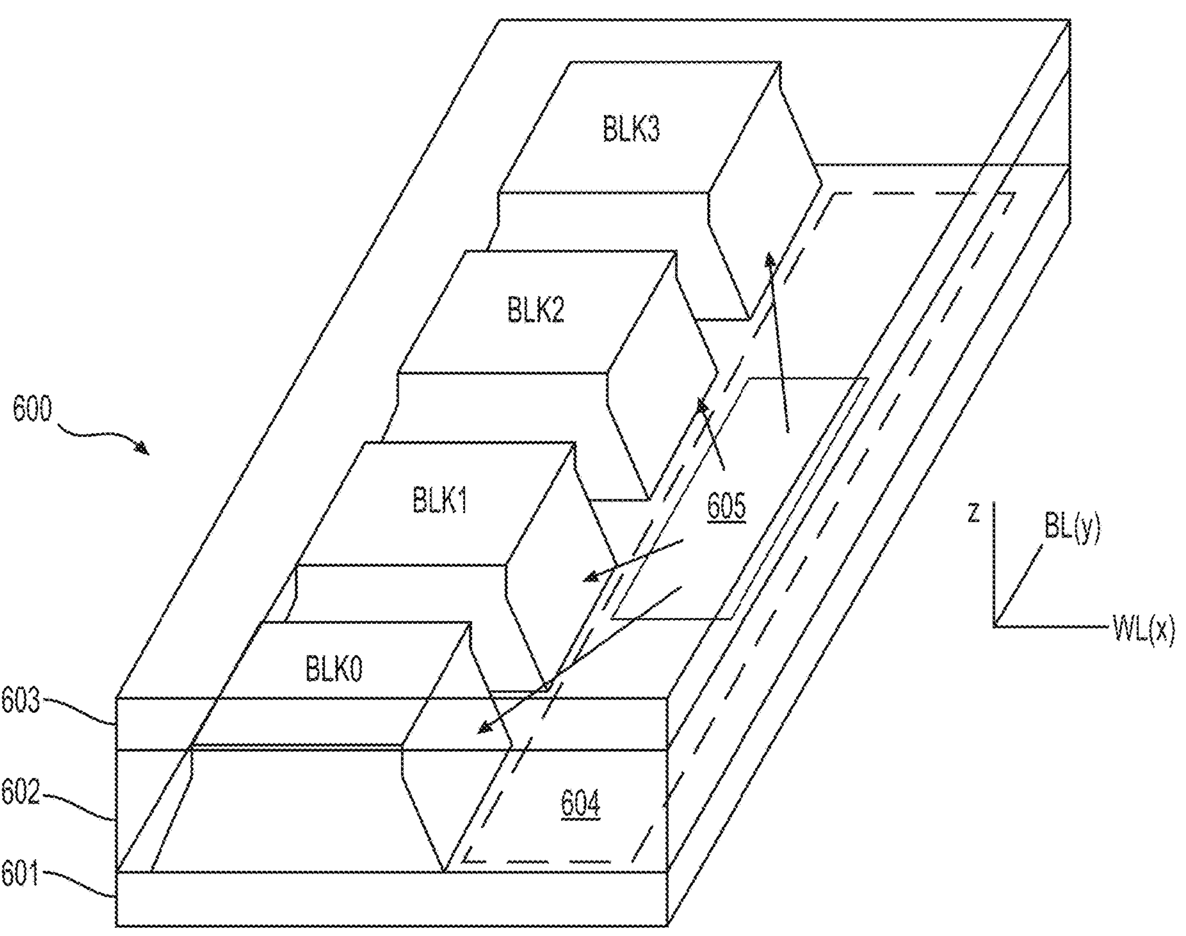
FIG. 6A is a perspective view of a set of blocks in an example three-dimensional configuration of the memory array of FIG. 1.

FIG. 6A is a perspective view of a set of blocks 600 in an example three-dimensional configuration of the memory array 126 of FIG. 1. On the substrate are example blocks BLK0, BLK1, BLK2, BLK3 of memory cells (storage elements) and a peripheral area 604 with circuitry for use by the blocks BLK0, BLK1, BLK2, BLK3. For example, the circuitry can include voltage drivers 605 which can be connected to control gate layers of the blocks BLK0, BLK1, BLK2, BLK3. In one approach, control gate layers at a common height in the blocks BLK0, BLK1, BLK2, BLK3 are commonly driven. The substrate 601 can also carry circuitry under the blocks BLK0, BLK1, BLK2, BLK3, along with one or more lower metal layers which are patterned in conductive paths to carry signals of the circuitry. The blocks BLK0, BLK1, BLK2, BLK3 are formed in an intermediate region 602 of the memory device. In an upper region 603 of the memory device, one or more upper metal layers are patterned in conductive paths to carry signals of the circuitry. Each block BLK0, BLK1, BLK2, BLK3 comprises a stacked area of memory cells, where alternating levels of the stack represent word lines. In one possible approach, each block BLK0, BLK1, BLK2, BLK3 has opposing tiered sides from which vertical contacts extend upward to an upper metal layer to form connections to conductive paths. While four blocks BLK0, BLK1, BLK2, BLK3 are illustrated as an example, two or more blocks can be used, extending in the x- and/or y-directions.

In one possible approach, the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

Figure 6B:
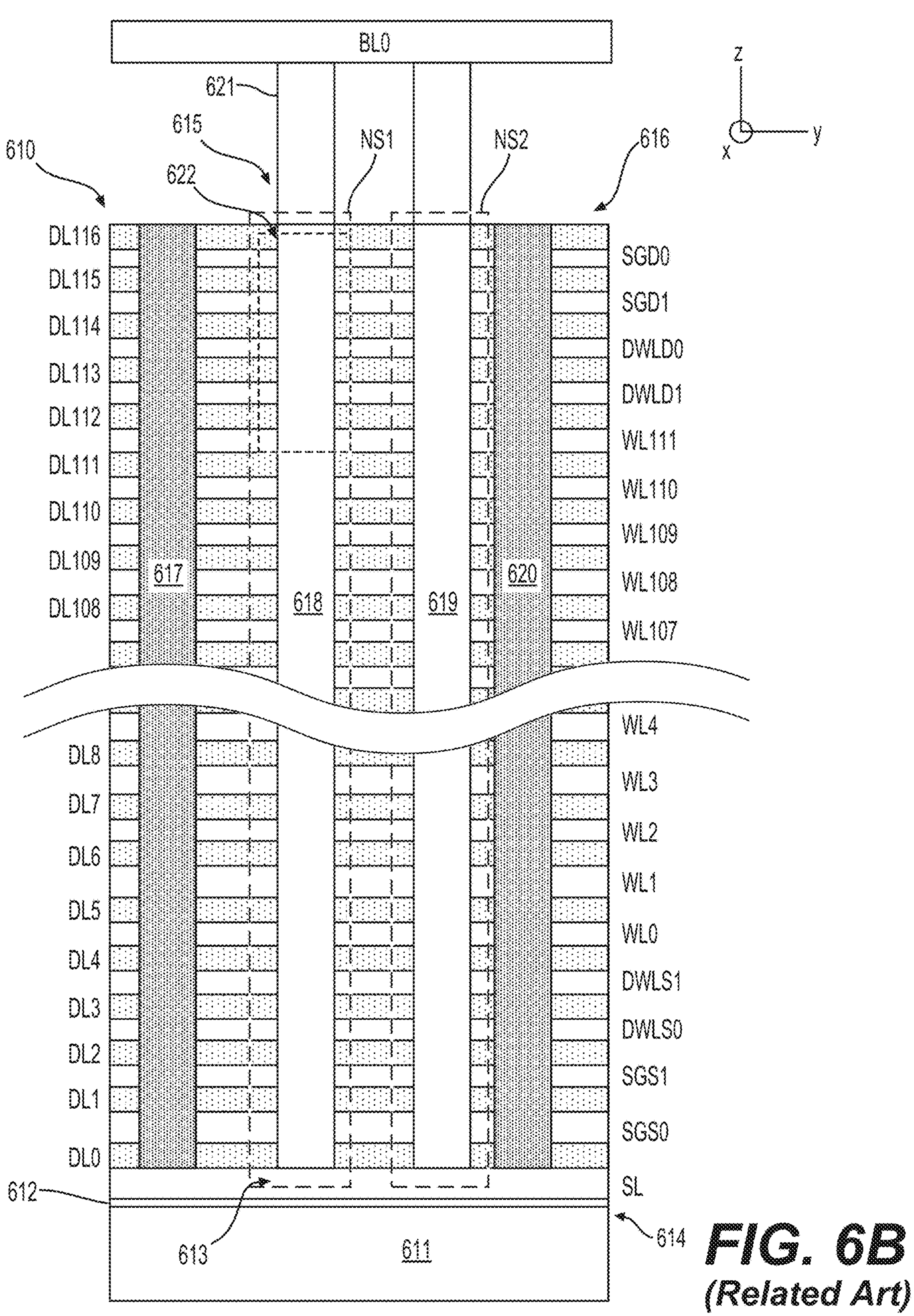
FIG. 6B depicts an example cross-sectional view of a portion of one of the blocks of FIG. 6A.

FIG. 6B illustrates an example cross-sectional view of a portion of one of the blocks BLK0, BLK1, BLK2, BLK3 of FIG. 6A. The block comprises a stack 610 of alternating conductive and dielectric layers. In this example, the conductive layers comprise two SGD layers, two SGS layers and four dummy word line layers DWLD0, DWLD1, DWLS0 and DWLS1, in addition to data word line layers (word lines) WL0-WL111. The dielectric layers are labelled as DL0-DL116. Further, regions of the stack 610 which comprise NAND strings NS1 and NS2 are illustrated. Each NAND string encompasses a memory hole 618, 619 which is filled with materials which form memory cells adjacent to the word lines. A region 622 of the stack 610 is shown in greater detail in FIG. 6D and is discussed in further detail below. The dielectric layers can have variable thicknesses such that some of the conductive layers can be closer to or further from neighboring conductive layers. The thicknesses of the dielectric layers affects the "ON pitch," which is a factor in memory density. Specifically, a smaller ON pitch allows for more memory cells in a given area but may compromise reliability.

The stack 610 includes a substrate 611, an insulating film 612 on the substrate 611, and a portion of a source line SL. NS1 has a source-end 613 at a bottom 614 of the stack and a drain-end 615 at a top 616 of the stack 610. Contact line connectors (e.g., slits, such as metal-filled slits) 617, 620 may be provided periodically across the stack 610 as interconnects which extend through the stack 610, such as to connect the source line to a particular contact line above the stack 610. The contact line connectors 617, 620 may be used during the formation of the word lines and subsequently filled with metal. A portion of a bit line BL0 is also illustrated. A conductive via 621 connects the drain-end 615 to BL0.

Figure 6C:
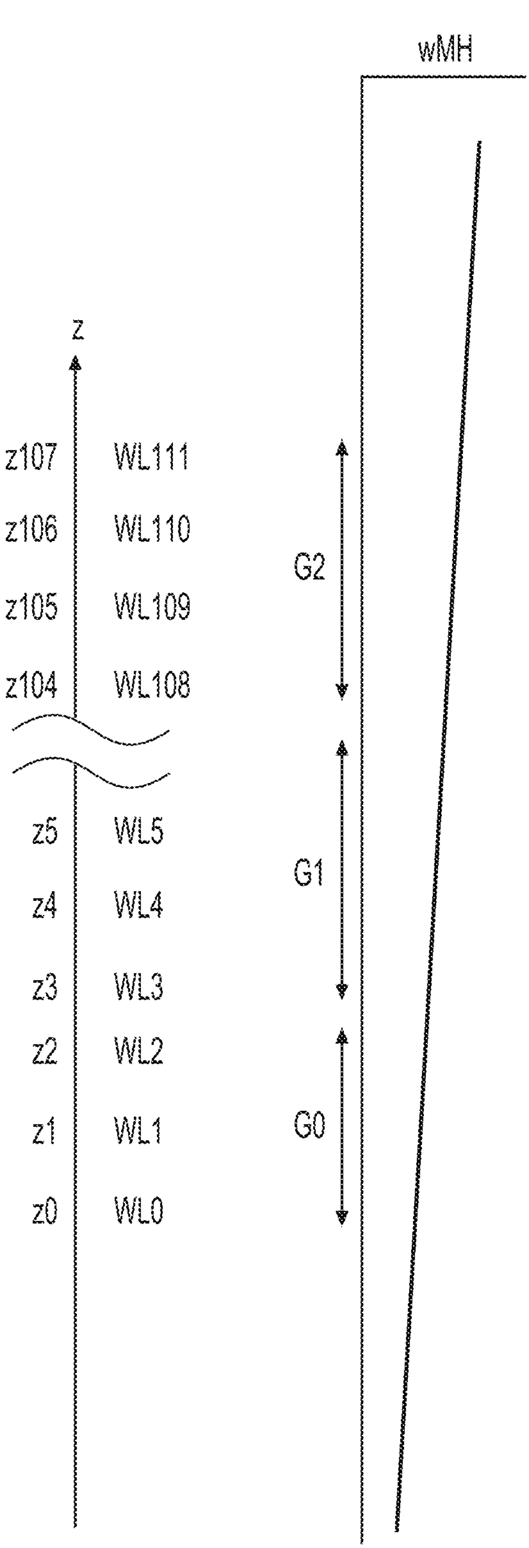
FIG. 6C depicts a plot of memory hole diameter in the stack of FIG. 6B.

FIG. 6C illustrates a plot of memory hole diameter in the stack of FIG. 6B. The vertical axis is aligned with the stack of FIG. 6B and illustrates a width (wMH), e.g., diameter, of the memory holes 618 and 619. The word line layers WL0-WL111 of FIG. 6A are repeated as an example and are at respective heights z0-z111 in the stack. In such a memory device, the memory holes which are etched through the stack have a very high aspect ratio. For example, a depth-to-diameter ratio of about 25-30 is common. The memory holes may have a circular cross-section. Due to the etching process, the memory hole width can vary along the length of the hole. Typically, the diameter becomes progressively smaller from the top to the bottom of the memory hole. That is, the memory holes are tapered, narrowing at the bottom of the stack. In some cases, a slight narrowing occurs at the top of the hole near the select gate so that the diameter becomes slightly wider before becoming progressively smaller from the top to the bottom of the memory hole.

Figure 6D:
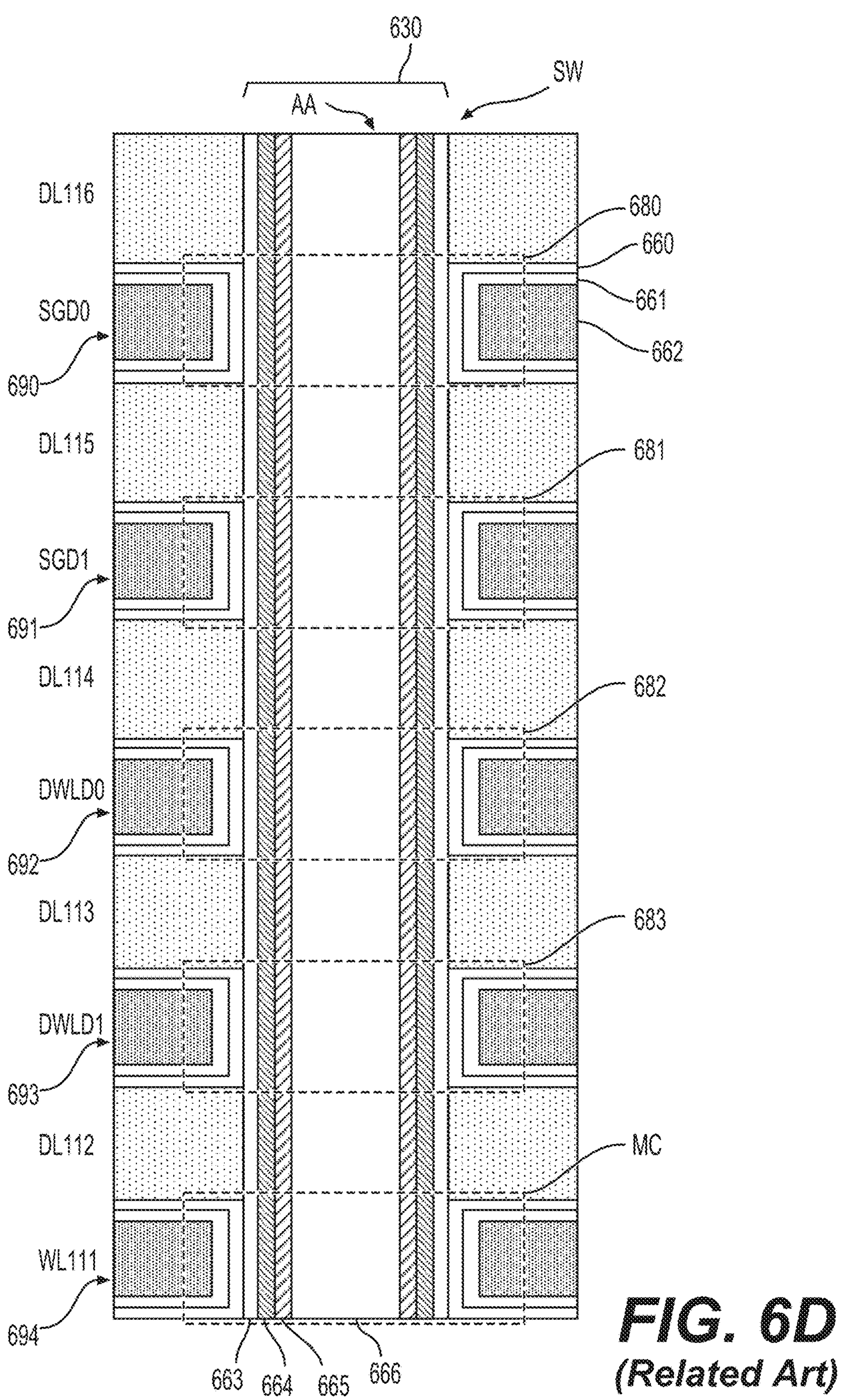
FIG. 6D depicts a close-up view of region 622 of the stack of FIG. 6B.

FIG. 6D illustrates a close-up view of the region 622 of the stack 610 of FIG. 6B. Memory cells are formed at the different levels of the stack at the intersection of a word line layer and a memory hole. In this example, SGD transistors 680, 681 are provided above dummy memory cells 682, 683 and a data memory cell MC. A number of layers can be deposited along the sidewall (SW) of the memory hole 630 and/or within each word line layer, e.g., using atomic layer deposition. For example, each column (e.g., the pillar which is formed by the materials within a memory hole 630) can include a charge-trapping layer or film 663 such as SiN or other nitride, a tunneling layer 664, a polysilicon body or channel 665, and a dielectric core 666. A word line layer can include a blocking oxide/block high-k material 660, a metal barrier 661, and a conductive metal such as Tungsten as a control gate. For example, control gates 690, 691, 692, 693, and 694 are provided. In this example, all of the layers except the metal are provided in the memory hole 630. In other approaches, some of the layers can be in the control gate layer. Additional pillars are similarly formed in the different memory holes. A pillar can form a columnar active area (AA) of a NAND string.

When a memory cell is programmed, electrons are stored in a portion of the charge-trapping layer which is associated with the memory cell. These electrons are drawn into the charge-trapping layer from the channel, and through the tunneling layer. The threshold voltage Vt of a memory cell is increased in proportion to the amount of stored charge. During a sensing operation, the threshold voltage Vt is detected or measured. During an erase operation, the electrons return to the channel.

Each of the memory holes 630 can be filled with a plurality of annular layers comprising a blocking oxide layer, a charge trapping layer 663, a tunneling layer 664 and a channel layer. A core region of each of the memory holes 630 is filled with a body material, and the plurality of layers are between the core region and the word line layer in each of the memory holes 630. In some cases, the charge trapping layer 663 and the tunneling layer 664 are annular in shape. In other cases, as discussed in further detail below, these layers are semi-circular in shape.

The NAND string can be considered to have a floating body channel because the length of the channel is not formed on a substrate. Further, the NAND string is provided by a plurality of word line layers above one another in a stack, and separated from one another by dielectric layers.

FIG. 7A illustrates a top view of an example word line layer WL0 of the stack 610 of FIG. 6B. As mentioned, a three-dimensional memory device can comprise a stack of alternating conductive and dielectric layers. The conductive layers provide the control gates of the SG transistors and memory cells. The layers used for the SG transistors are SG layers and the layers used for the memory cells are word line layers. Further, memory holes are formed in the stack and filled with a charge-trapping material and a channel material. As a result, a vertical NAND string is formed. Source lines are connected to the NAND strings below the stack and bit lines are connected to the NAND strings above the stack.

A block BLK in a three-dimensional memory device can be divided into a plurality of string groups, or simply "strings," where each strings comprises a plurality of NAND strings that have a common SGD control line. For example, see the SGD lines/control gates SGD0, SGD1, SGD2 and SGD3 in the Strings 0, 1, 2, and 3, respectively. Further, a word line layer in a block can be divided into regions. Each region is in a respective string and can extend between contact line connectors (e.g., slits) which are formed periodically in the stack to process the word line layers during the fabrication process of the memory device. This processing can include replacing a sacrificial material of the word line layers with metal. Generally, the distance between contact line connectors should be relatively small to account for a limit in the distance that an etchant can travel laterally to remove the sacrificial material, and that the metal can travel to fill a void which is created by the removal of the sacrificial material. For example, the distance between contact line connectors may allow for a few rows of memory holes between adjacent contact line connectors. The layout of the memory holes and contact line connectors should also account for a limit in the number of bit lines which can extend across the region while each bit line is connected to a different memory cell. After processing the word line layers, the contact line connectors can optionally be filed with metal to provide an interconnect through the stack.

In this example, there are four rows of memory holes between adjacent contact line connectors. A row here is a group of memory holes which are aligned in the x-direction. Moreover, the rows of memory holes are in a staggered pattern to increase the density of the memory holes. The word line layer or word line is divided into regions WL0*a*, WL0*b*, WL0*c* and WL0*d* which are each connected by a contact line 713. The last region of a word line layer in a block can be connected to a first region of a word line layer in a next block, in one approach. The contact line 713, in turn, is connected to a voltage driver for the word line layer. The region WL0*a* has example memory holes 710, 711 along a contact line 712. The region WL0*b* has example memory holes 714, 715. The region WL0*c* has example memory holes 716, 717. The region WL0*d* has example memory holes 718, 719. The memory holes are also shown in FIG. 7B. Each memory hole can be part of a respective NAND string. For example, the memory holes 710, 714, 716 and 718 can be part of NAND strings NS0_String 0, NS1_String 1, NS2_String 2, NS3_String 3, and NS4_String 4, respectively.

Each circle represents the cross-section of a memory hole at a word line layer or SG layer. Example circles shown with dashed lines represent memory cells which are provided by the materials in the memory hole and by the adjacent word line layer. For example, memory cells 720, 721 are in WL0*a*, memory cells 724, 725 are in WL0*b*, memory cells 726, 727 are in WL0*c*, and memory cells 728, 729 are in WL0*d*. These memory cells are at a common height in the stack.

Contact line connectors (e.g., slits, such as metal-filled slits) 701, 702, 703, 704 may be located between and adjacent to the edges of the regions WL0*a*-WL0*d*. The contact line connectors 701, 702, 703, 704 provide a conductive path from the bottom of the stack to the top of the stack. For example, a source line at the bottom of the stack may be connected to a conductive line above the stack, where the conductive line is connected to a voltage driver in a peripheral region of the memory device.

FIG. 7B illustrates a top view of an example top dielectric layer DL116 of the stack of FIG. 6B. The dielectric layer is divided into regions DL116*a*, DL116*b*, DL116*c* and DL116*d*. Each region can be connected to a respective voltage driver. This allows a set of memory cells in one region of a word line layer being programmed concurrently, with each memory cell being in a respective NAND string which is connected to a respective bit line. A voltage can be set on each bit line during each programming, sensing, or erasing operation.

The region DL116*a* has the example memory holes 710, 711 along a contact line 712, which is coincident with a bit line BL0. A number of bit lines extend above the memory holes and are connected to the memory holes as indicated by the "X" symbols. BL0 is connected to a set of memory holes which includes the memory holes 711, 715, 717, 719. Another example bit line BL1 is connected to a set of memory holes which includes the memory holes 710, 714, 716, 718. The contact line connectors (e.g., slits, such as metal-filled slits) 701, 702, 703, 704 from FIG. 7A are also illustrated, as they extend vertically through the stack. The bit lines can be numbered in a sequence BL0-BL23 across the DL116 layer in the x-direction.

Different subsets of bit lines are connected to memory cells in different rows. For example, BL0, BL4, BL8, BL12, BL16, BL20 are connected to memory cells in a first row of cells at the right-hand edge of each region. BL2, BL6, BL10, BL14, BL18, BL22 are connected to memory cells in an adjacent row of cells, adjacent to the first row at the right-hand edge. BL3, BL7, BL11, BL15, BL19, BL23 are connected to memory cells in a first row of cells at the left-hand edge of each region. BL1, BL5, BL9, BL13, BL17, BL21 are connected to memory cells in an adjacent row of memory cells, adjacent to the first row at the left-hand edge.

Figure 8:
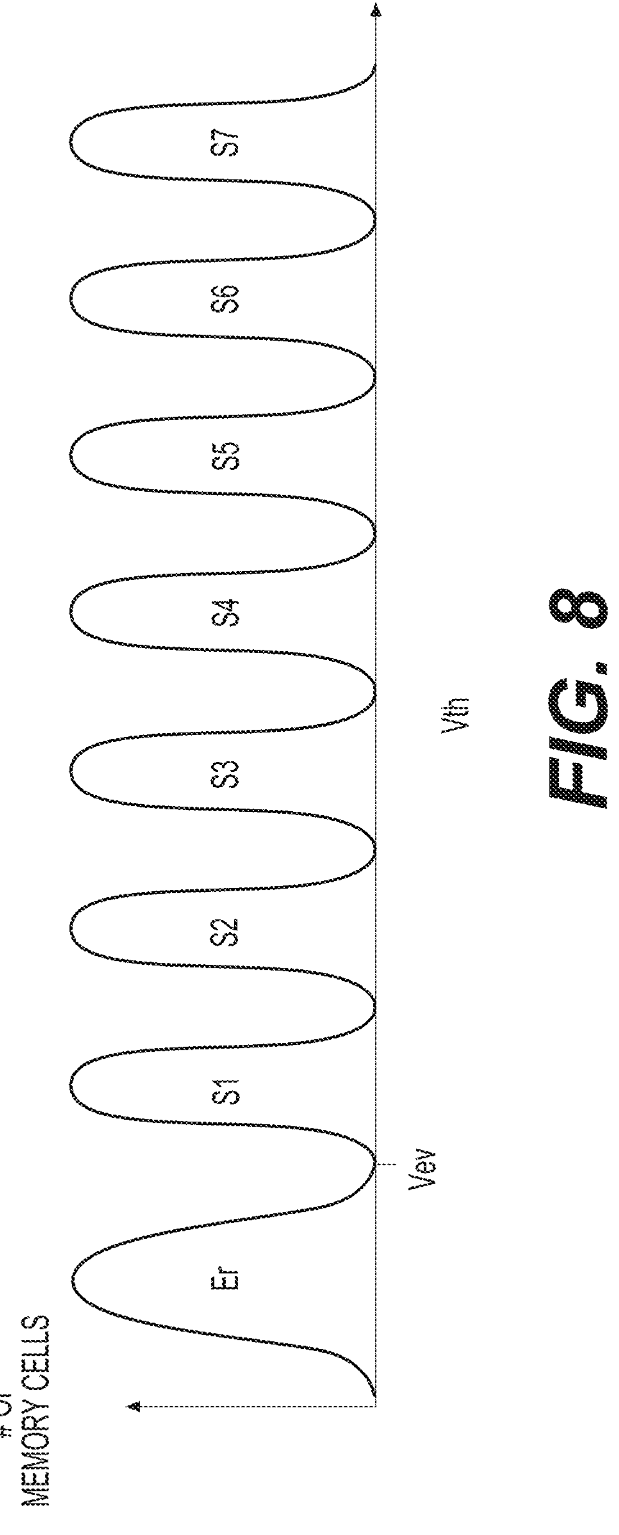
FIG. 8 depicts a threshold voltage distribution of a page of memory cells programmed to three bits per memory cell (TLC)

The memory cells of the memory blocks can be programmed to store one or more bits of data in multiple data states, each of which is associated with a respective threshold voltage Vt range and with a respective bit or series of bits. For example, FIG. 8 depicts a threshold voltage Vt distribution of a group of memory cells programmed according to a three bits per memory cell (TLC) storage scheme. The TLC storage scheme includes eight total data states, namely the erased state (Er) and seven programmed data states (S1, S2, S3, S4, S5, S6, and S7) at increasing voltage ranges. Other storage schemes are also available, such as one bit per memory cell (SLC) with two data states, two bits per cell (MLC) with four data states, four bits per cell (QLC) with sixteen data states, or five bits per cell (PLC) with thirty-two data states.

An erase operation involves transitioning the memory cells of a memory block from the threshold voltages Vt associated with their respective programmed data states to the erased state. During the erase operation, it is desired to lower the threshold voltages Vt of the memory cells below an erase-verify voltage Vev level that represents an upper bound of the erased data state Er. An erase operation can include a number of erase loops, which have erase pulses followed by erase-verify operations (hereinafter referred to simply as "erase-verify"). The erase operation is typically performed on a memory block or sub-block level rather than a word line level. In other words, one entire memory block or a sub-block, which includes a group of word lines in a memory block, is erased at a time. This is in contrast to programming, where the memory cells are programmed one word line at a time.

Figure 9:
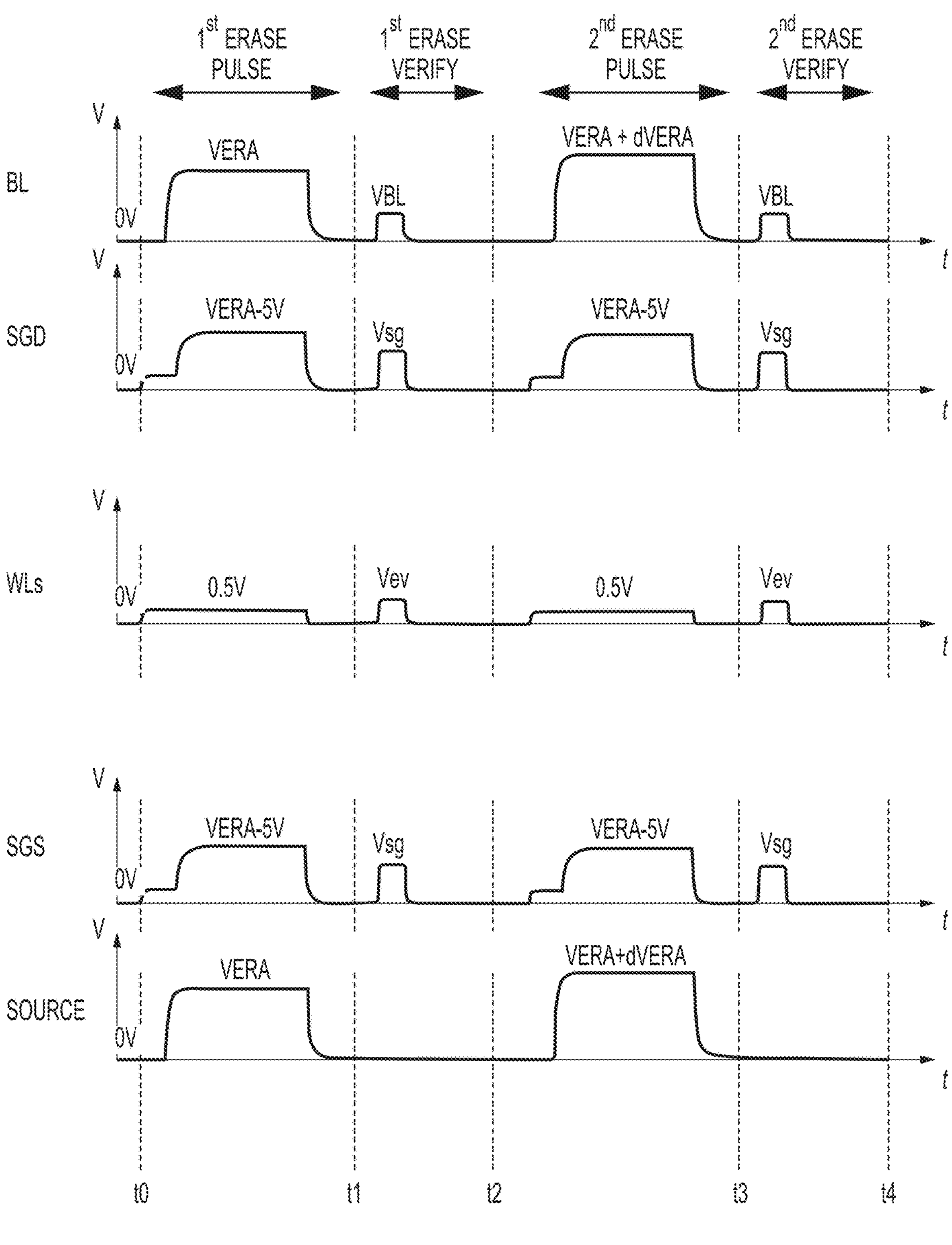
FIG. 9 is a waveform of the voltages applied to a selected word line during an example erase operation.

Turning now to FIG. 9, during the erase pulse, circuitry in the memory device applies an erase voltage VERA to the NAND strings of the memory block while a very low voltage (for example, zero Volts) is applied to the word lines of the memory block to provide a positive channel-to-gate voltage difference for the memory cells of the memory block to drive electrons out of the charge storing materials of the memory cells, thereby reducing the threshold voltages Vt of the memory cells. During erase-verify, a verify voltage Vev is applied to the control gates of the memory cells and sensing circuitry is used to sense currents in the NAND strings to determine if the memory cells have been sufficiently erased. If an insufficient number of memory cells have been sufficiently erased, then the erase voltage VERA is increased by a fixed step size dVERA and this process is repeated in one or more subsequent erase loops until erase-verify passes. Erase-verify is typically performed only for a single string group at a time. For example, in an example where a memory block includes four strings (String 0, String 1, String 2, String 3), the four strings are verified sequentially, i.e., one after the other.

In some cases, to improve erase performance, the erase operation may skip erase-verify in a first erase loop of an erase operation. In other words, the second erase pulse immediately follows the first erase pulse without erase-verify and then erase-verify is included in all erase loops from the second erase loop on.

Typically, an erase operation continues uninterruptedly from beginning until end. However, in some cases, an erase operation can be suspended so that the memory device can do another, higher priority, operation, e.g., read data in another memory block. The "delay time" (the time that the erase operation of a selected memory block or sub-block is suspended) and the "suspend duration" (the duration of the suspension) can vary depending on the other operation that is performed. For example, in some cases, the suspend duration can be very short (e.g., less than 1 ms), very long (e.g., more than 10 s), or anywhere in between. An erase suspend-resume-go (SRG) technique is a mode where the memory device pauses the erase operation at the delay time for the entire suspension event (the suspend duration) and resumes the erase operation once the suspend duration is completed. In most cases, the suspend duration is unknown at the delay time.

The delay time, or the time of start of suspend, can occur at any point in the erase operation, e.g., during an erase pulse, during erase-verify, or anytime in between. Conventionally, after the suspend duration, the erase operation resumes with whatever operation was being performed at the delay time. For example, if the delay time occurs during an erase pulse, then the erase operation resumes with an erase pulse. Similarly, if the delay time occurs during erase-verify, then the erase operation resumes with erase-verify.

Figure 10:
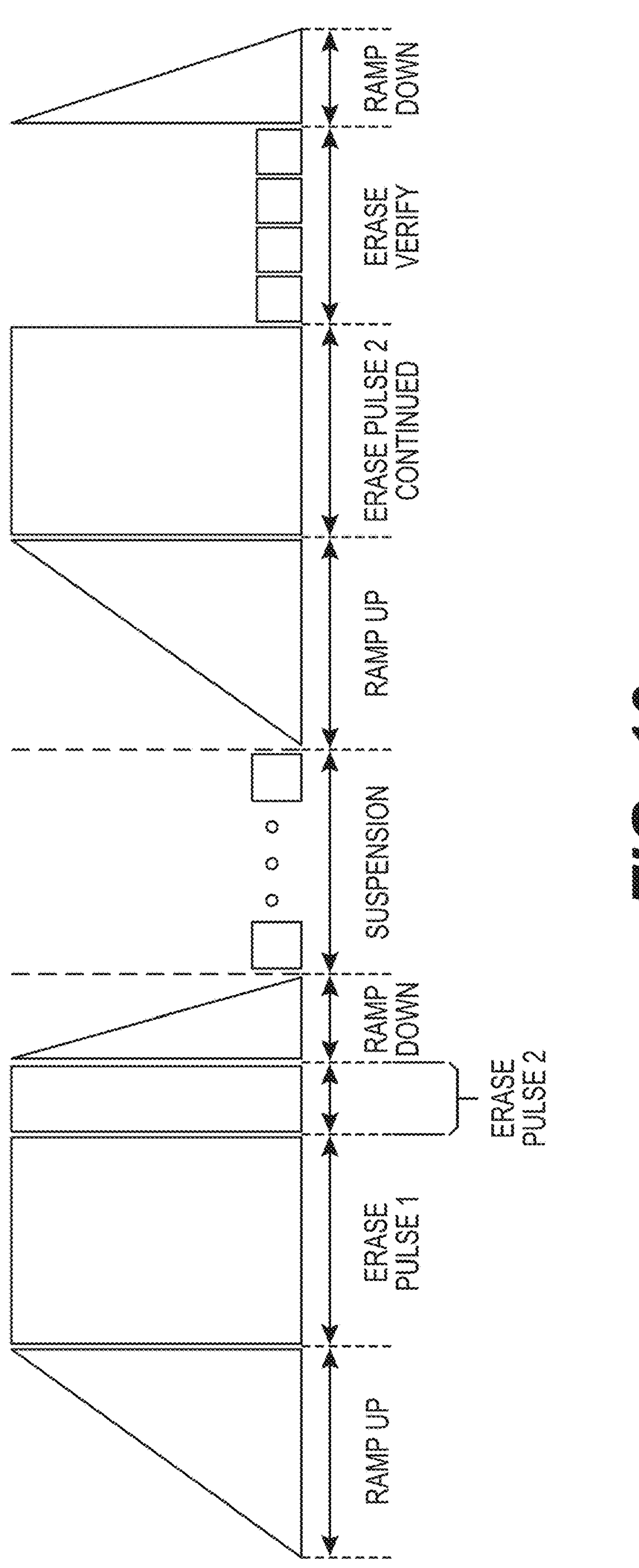
FIG. 10 is a timing chart of an exemplary erase operation where a suspension event occurs.

FIG. 10 is a timing chart for an exemplary erase operation which includes a suspension. In this example, the erase operation includes a first erase pulse, and then the suspension occurs during a second erase pulse. After the suspend duration, the erase operation resumes with the second erase pulse. Erase-verify then follows the second erase pulse. Erase-verify is illustrated as four squares in this Figure because the exemplary memory block has four strings. Each square represents erase-verify of one of the four strings. This scenario can lead to the memory cells being over-erased if the threshold voltages Vt of the memory cells were nearly at the erase-verify voltage Vev at the time of the suspension and then received the continued second erase pulse prior to the first erase-verify. Over-erase is undesirable because it may stress the memory cells and compromise their operating life and also because it will reduce performance during a subsequent programming operation since the memory cells will start the programming operation at a lower (e.g., more negative) voltage.

An aspect of the present disclosure is an erase technique that limits or prevents over-erase from occurring with minimal impact on erase performance (tErase). More specifically, according these techniques, if an erase operation is suspended during an erase pulse, then, when the erase operation resumes, rather than resuming with the erase pulse, an erase-verify operation is performed. However, in order to minimize the impact on performance, at this stage, only a portion of the memory block (specifically, a single string) is verified.

Figure 12:
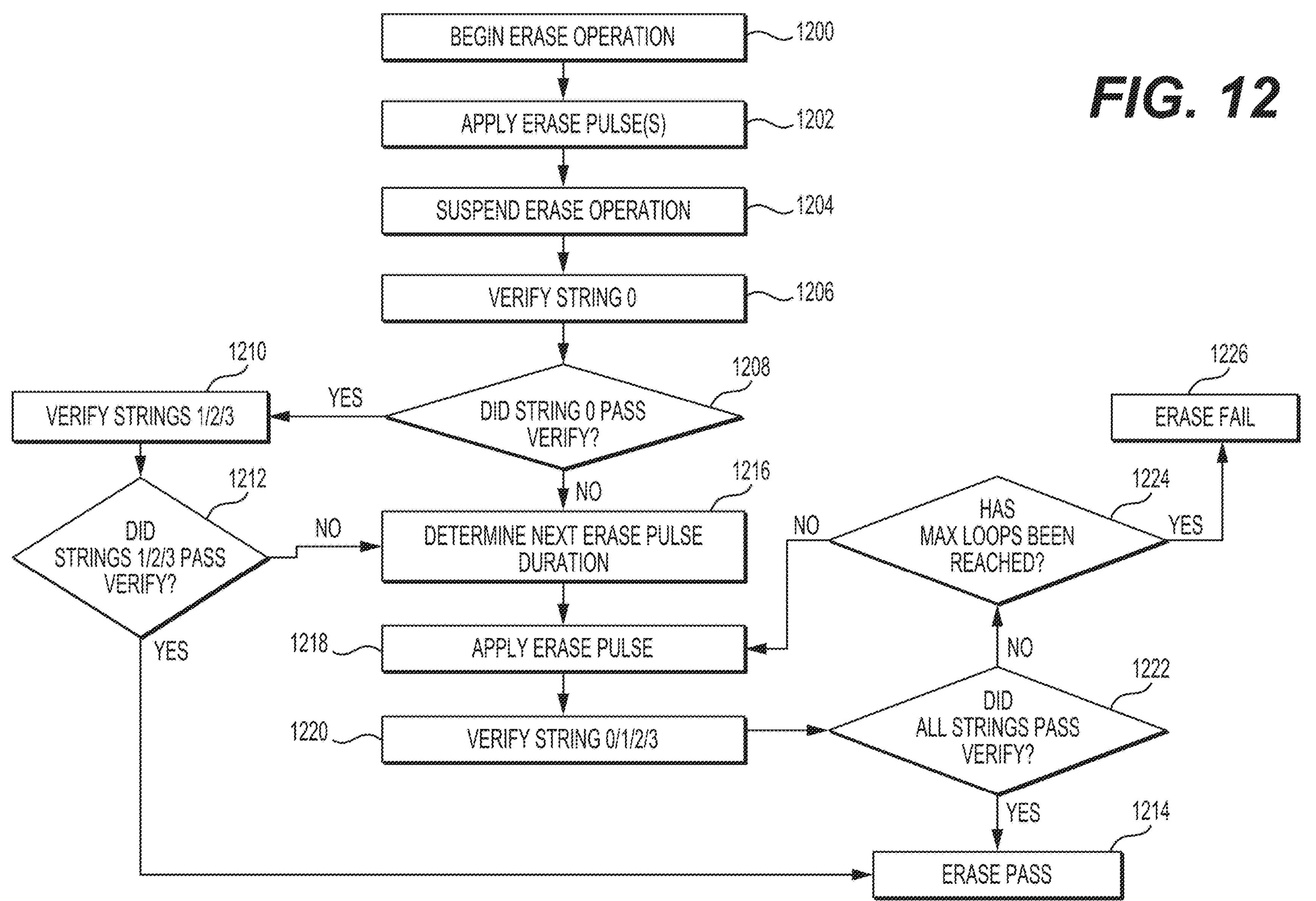
FIG. 12 is a flow chart depicting the steps of erasing a memory block according to an exemplary embodiment of the present disclosure.

FIG. 12 is a flow chart depicting the steps of performing an erase operation according to an exemplary embodiment of the present disclosure. These steps could be performed by the controller; a processor or processing device or any other circuitry, executing instructions stored in memory; and/or other circuitry described herein that is specifically configured/programmed to execute the following steps.

At step 1200, the erase operation begins. During the erase operation, the number of erase loops are counted. At step 1202, at least one erase pulse is applied to a selected memory block or sub-block. In one presently preferred embodiment, up to two erase pulses may be performed at step 1202 with no erase-verify following the first erase pulse.

At step 1204, a suspension event begins at a delay time, which occurs during the at least one erase pulse at step 1202 due to another memory operation taking priority over the ongoing erase operation. The suspension event could be, for example, the host reading or writing data to another memory block. Rather than continuing with an erase pulse at the ending of the suspension event, at step 1206, erase-verify is performed on only a portion of the memory block. More specifically, in the exemplary embodiment, only String 0 is verified at step 1206. However, any of the other strings could be verified at this stage. Because only one of the four strings is verified at this step, the time to conduct step 1206 is relatively short in comparison to a typical erase-verify operation, i.e., the performance penalty caused by verifying after suspend rather than applying another erase pulse is minimal. Also during step 1206, the number of memory cells that failed verify (i.e., have threshold voltages Vt above the verify voltage Vev) are counted to establish a Count.

At decision step 1208, it is determined if String 0 passed erase-verify. In other words, it is determined if a sufficiently small number of memory cells still have threshold voltages Vt above the erase-verify voltage Vev.

If the answer at decision step 1208 is "yes," then the erase operation is either complete or nearly complete. At step 1210, Strings 1, 2, and 3 are verified. At decision step 1212, it is determined if Strings 1, 2, and 3 passed erase-verify. If the answer at decision step 1212 is "yes," then at step 1214, the erase operation passes without another erase pulse being needed.

If the answer at decision step 1208 or 1212 is "no," then another erase pulse is needed. At decision step 1216, a next erase pulse duration is determined by comparing the Count to at least one predetermined threshold. In the exemplary embodiment, the erase pulse duration is determined by referencing a look-up table, such as the table depicted in FIG. 13.

Figure 14:
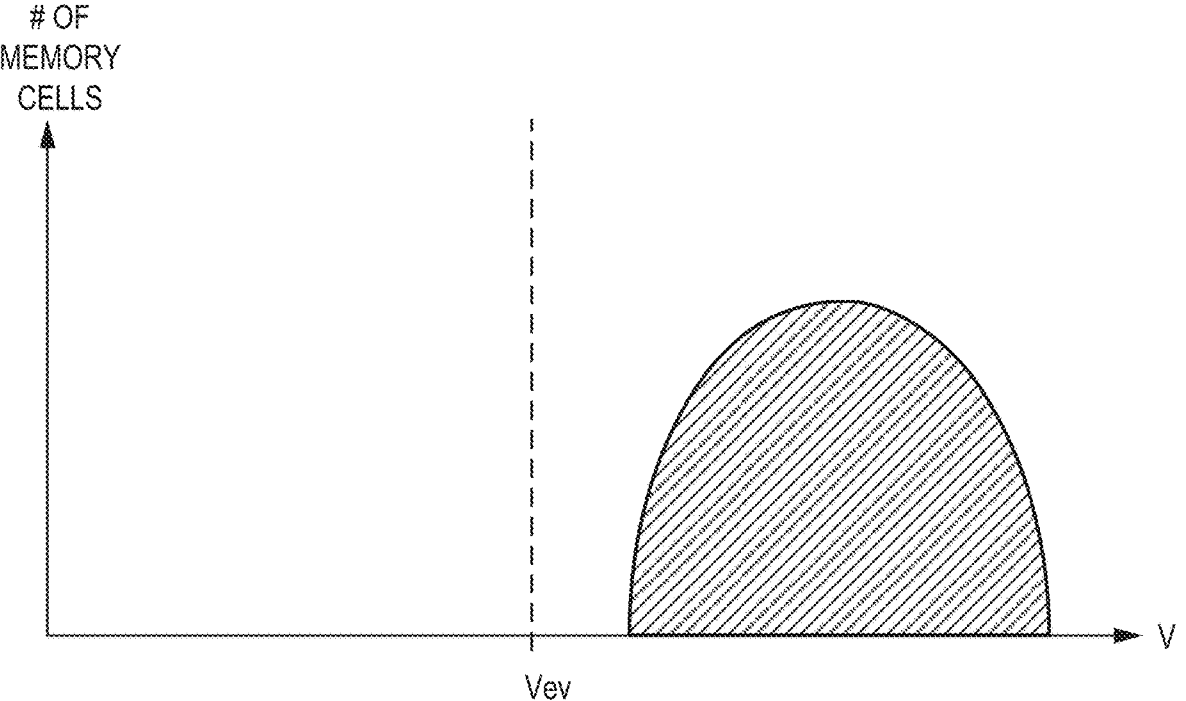
FIG. 14 is a threshold voltage distribution of a plurality of memory cells immediately following a suspension event and wherein the memory cells are in a first condition.

The look-up table of FIG. 13 depicts three conditions, listed as Conditions 1, 2, and 3. FIG. 14 depicts an example threshold voltage Vt distribution chart for a group of memory cells of String 0 that are in "Condition 1." As illustrated, in this condition, the Count (the shaded area) is very high because all or more most memory cells have threshold voltages Vt above the erase-verify voltage Vev, and thus, the Count is greater than the predetermined Threshold. Turning back to FIG. 13, in this instance, the erase pulse duration for the next erase pulse is set at a baseline E_Time plus an offset Delta1. In other words, the erase pulse duration set at a very high level because the erase operation is not close to being completed.

Figure 15:
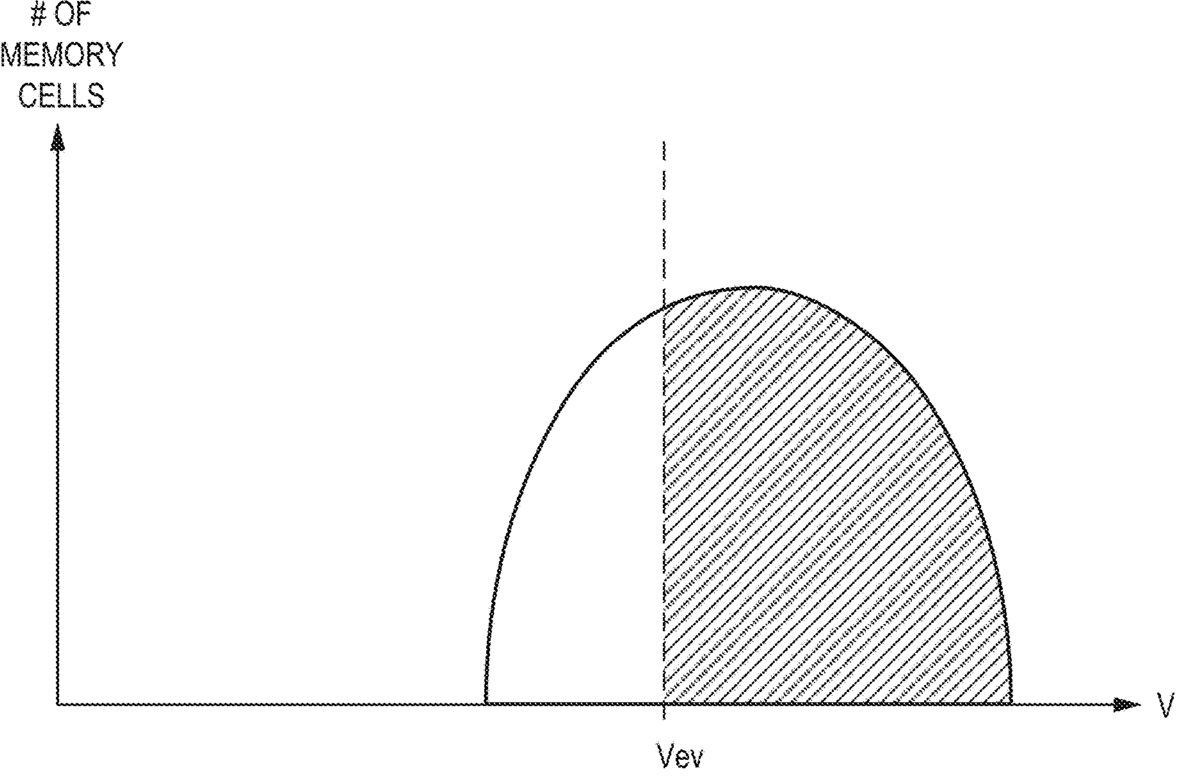
FIG. 15 is a threshold voltage distribution of a plurality of memory cells immediately following a suspension event and wherein the memory cells are in the second condition.

FIG. 15 depicts an example threshold voltage Vt distribution chart for a group of memory cells of String 0 that are in "Condition 2." As illustrated, in this condition, the Count (the shaded area) is high because many of the memory cells have threshold voltages Vt above the erase-verify voltage Vev, but far fewer than Condition 1. In this example, the Count is greater than zero (or some relatively low number) but it is less than the Threshold. Turning back to FIG. 13, in this instance, the erase pulse duration for the next erase pulse is set at the baseline E_Time plus an offset Delta2, which is less than the aforementioned Delta1. In other words, the erase pulse duration is set at a level that is less than Condition 1 because the erase operation is closer to being completed in Condition 2 than it is in Condition 1.

Figure 16:
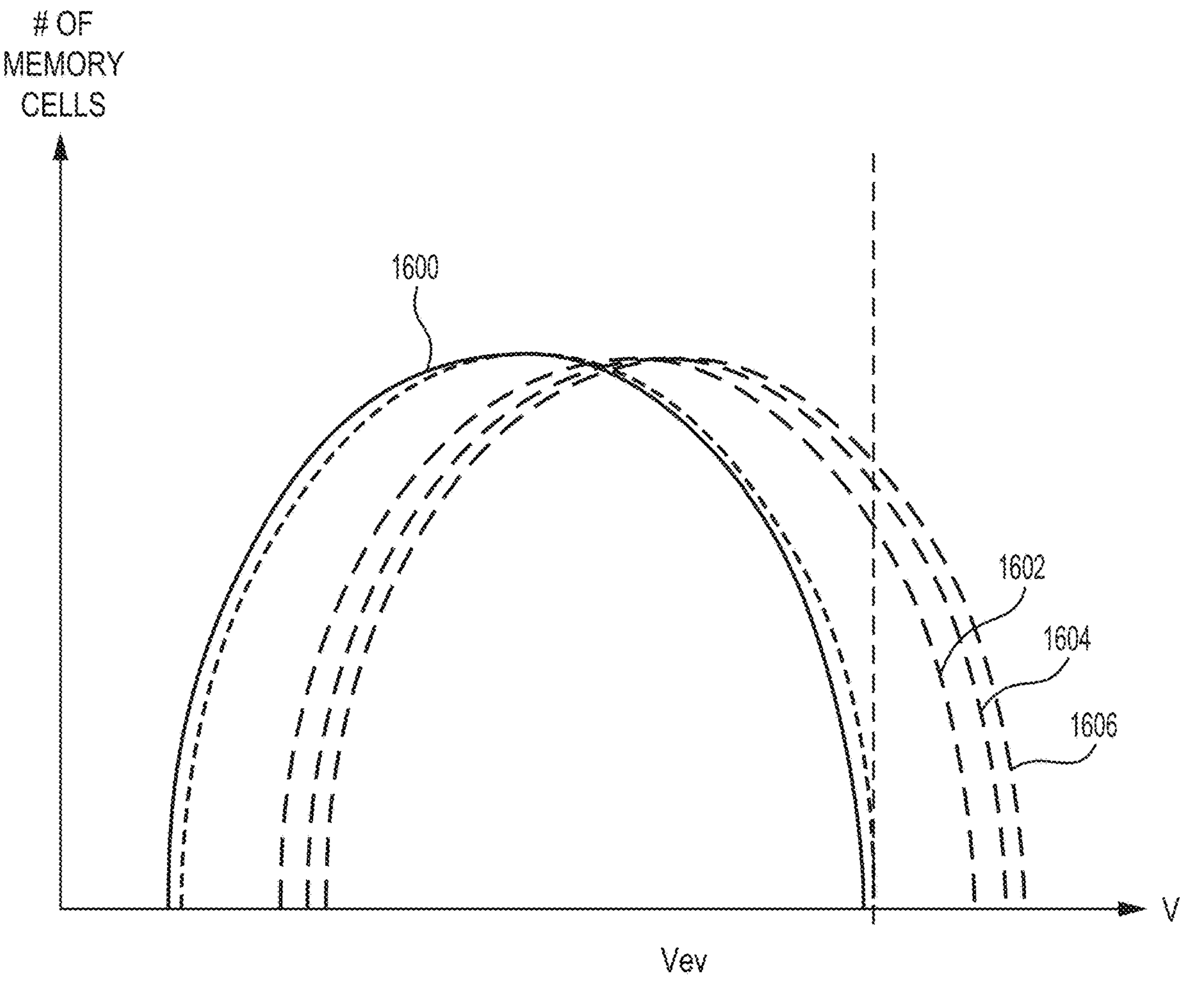
FIG. 16 is a threshold voltage distribution of a plurality of memory cells immediately following a suspension event and wherein the memory cells are in a third condition.

FIG. 16 depicts an example threshold voltage distribution plot for Condition 3, which occurs when String 0 (curve 1600) passes erase-verify but at least one of Strings 1, 2, and 3 (curves 1602, 1604, 1606 respectively) do not pass erase-verify. In this condition, the erase operation is nearly completed with only some memory cells needing to be further erased. Turning back to FIG. 13, in this instance, the erase pulse duration for the next erase pulse is set at the baseline E_Time minus an offset Delta3. Thus, because the erase operation is nearly completed in Condition 3, the erase pulse duration for the ensuing erase pulse is set at a very low level.

Turning back to FIG. 12, after the erase pulse duration is determined at step 1216, at step 1218, the erase pulse is applied to the selected memory block or sub-block. Following this erase pulse, at step 1220, all of the strings (Strings 0, 1, 2, and 3 in the example embodiment) are sequentially verified.

At decision step 1222, it is determined if all of the strings passed verify. If the answer at decision step 1222 is "yes," then the erase operation passes at step 1214. If the answer at decision step 1222 is "no," then at decision step 1224, it is determined if a predetermined maximum number of erase loops has been reached. If the answer at decision step 1224 is "no," then the process returns to step 1218 to begin a next erase loop. If the answer at decision step 1224 is "yes," then at step 1226, the erase operation fails.

Figure 11:
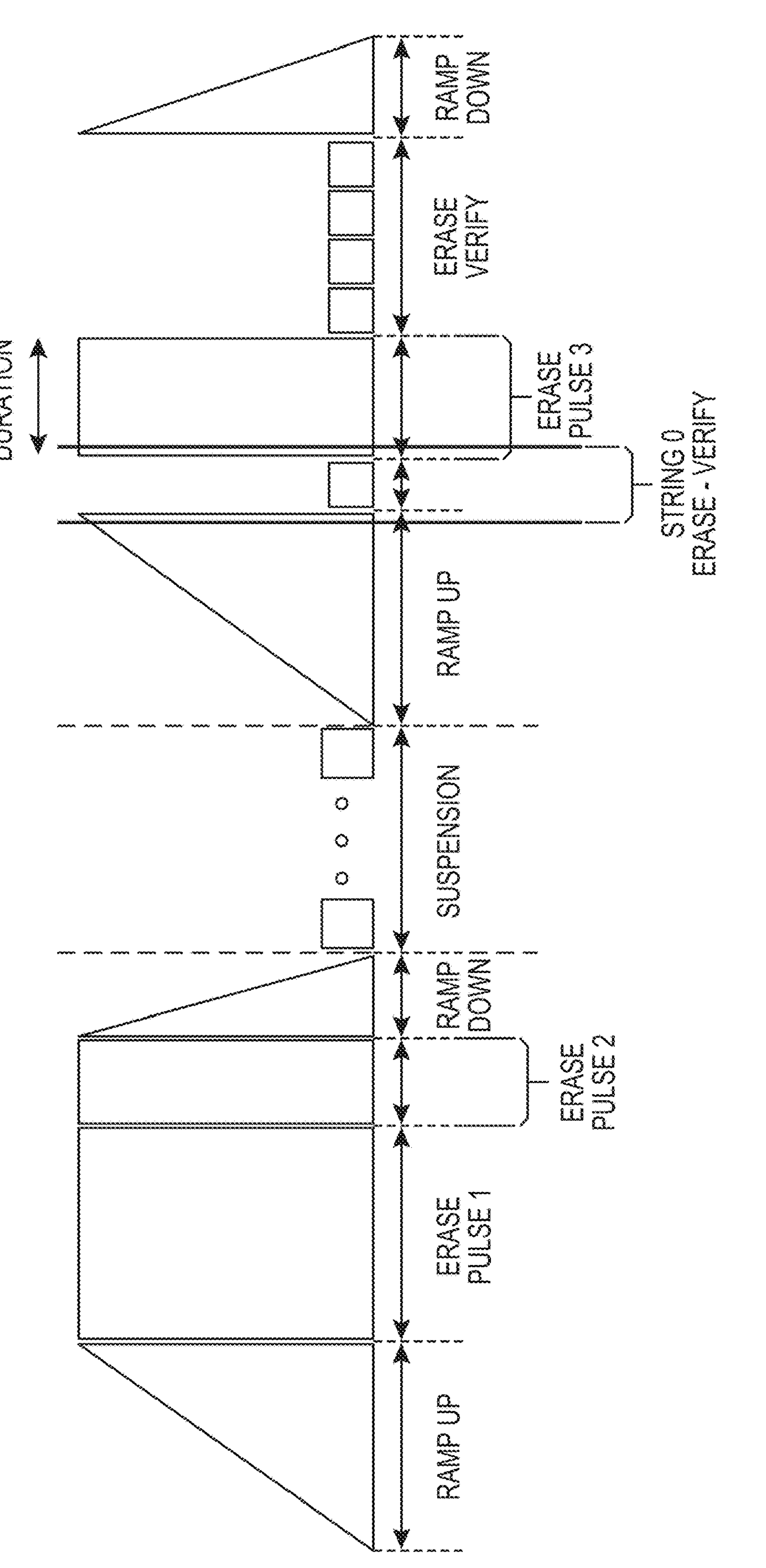
FIG. 11 is a timing chart of an exemplary erase operation according to the erase techniques of the present disclosure and where a suspension event occurs and wherein the memory cells immediately following the suspension event are in a second condition.

Turning back to the example timing chart of FIG. 11, in this example, the selected memory block or sub-block is determined at step 1216 discussed above to be in Condition 2, e.g., the erase operation is approximately halfway completed. Thus, the erase pulse duration is set at a medium level, e.g., E_Time+Delta2. In contrast, in the example of FIG. 17, the selected memory block or sub-block is determined to be in Condition 1, and thus, the erase pulse duration for the second erase pulse is set at a very high level, e.g., E_Time+Delta1. The example of FIG. 18 shows a timing chart where the selected memory block or sub-block has been determined to be in Condition 3 (erase-verify is very nearly completed). As illustrated, because String 0 passed erase-verify, before the third erase pulse, Strings 1, 2, and 3 are also verified. At least one of these strings did not pass erase-verify, which necessitated the third erase pulse. Thus, the erase pulse duration for the third erase pulse is set at a very low level, e.g., E_Time-Delta3. If all of the strings had passed erase-verify, then no third erase pulse would have been necessary.

Figure 17:
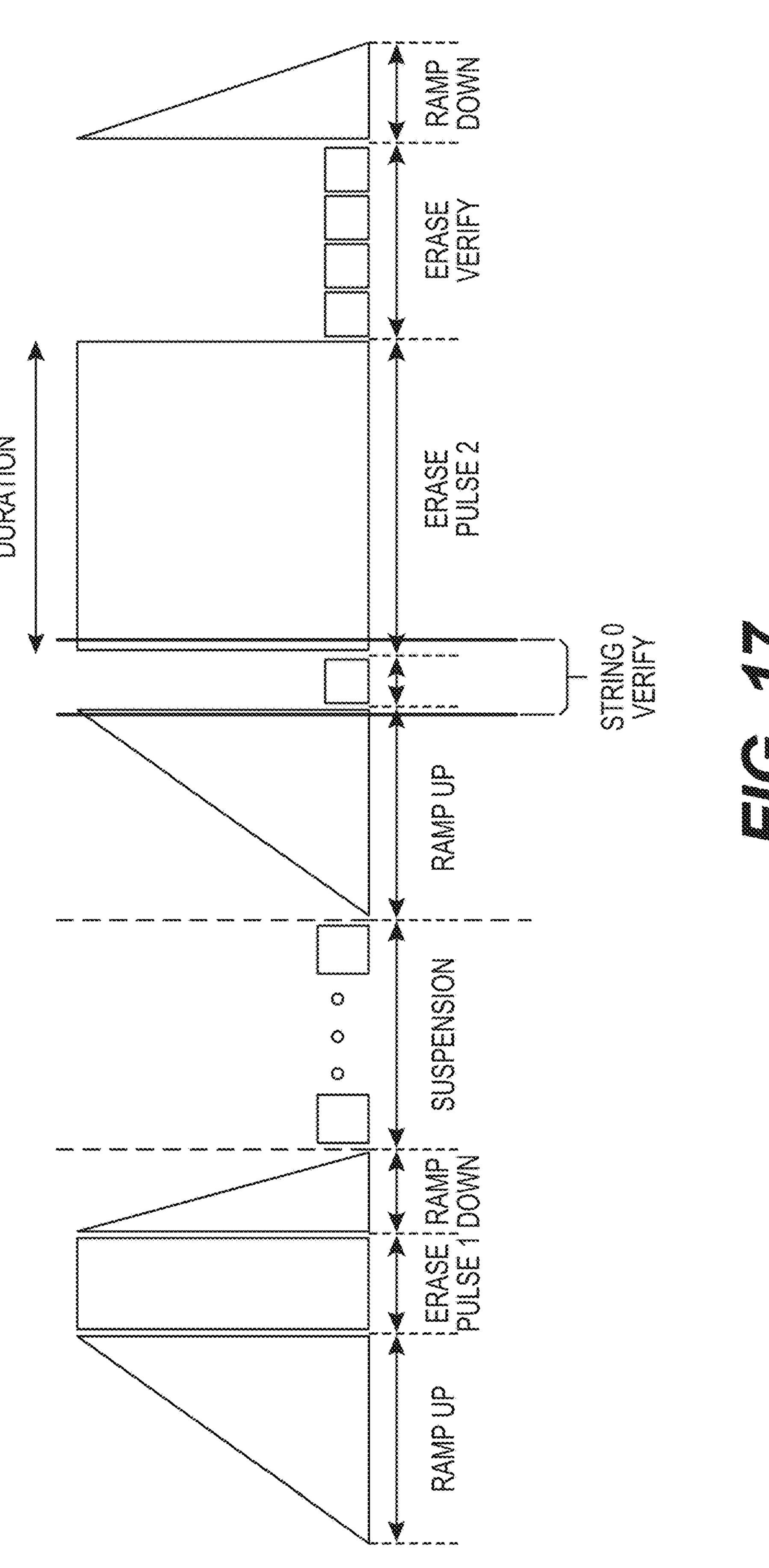
FIG. 17 is a timing chart an exemplary erase operation according to the erase techniques of the present disclosure and where a suspension event occurs and wherein the memory cells immediately following the suspension event are in the first condition.
Figure 18:
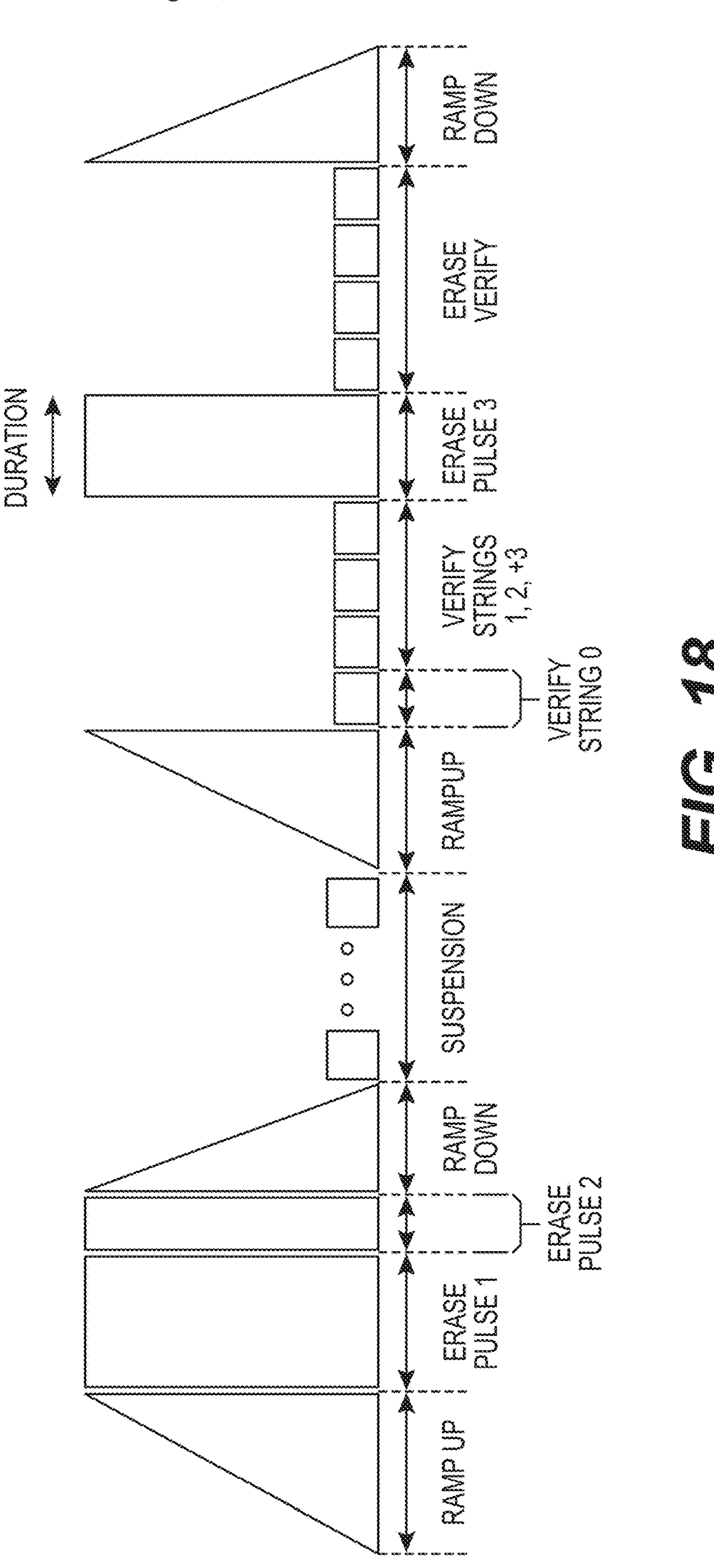
FIG. 18 is a timing chart an exemplary erase operation according to the erase techniques of the present disclosure and where a suspension event occurs and wherein the memory cells immediately following the suspension event are in the third condition.

Comparing FIGS. 11, 17, and 18, in the exemplary embodiment, it can be seen that the erase pulse duration following the suspension event has a longest first timeframe in Condition 1 (FIG. 17), a medium second timeframe in Condition 2 (FIG. 11), and a shortest third timeframe in Condition 3 (FIG. 18). In some embodiments, there can be more than three conditions, each associated with different timeframes to further optimize the erase pulse duration. This may require comparing the Count to more than one predetermined threshold at aforementioned step 1216 of the flow chart depicted in FIG. 12.

These erase techniques help prevent over-erase from occurring with a very low impact on erase-performance (a minimal increase in erase time tErase) because only a portion (e.g., one string) of the selected memory cells being erased are initially verified following the suspension event.

Various terms are used herein to refer to particular system components. Different companies may refer to a same or similar component by different names and this description does not intend to distinguish between components that differ in name but not in function. To the extent that various functional units described in the following disclosure are referred to as "modules," such a characterization is intended to not unduly restrict the range of potential implementation mechanisms. For example, a "module" could be implemented as a hardware circuit that includes customized very-large-scale integration (VLSI) circuits or gate arrays, or off-the-shelf semiconductors that include logic chips, transistors, or other discrete components. In a further example, a module may also be implemented in a programmable hardware device such as a field programmable gate array (FPGA), programmable array logic, a programmable logic device, or the like. Furthermore, a module may also, at least in part, be implemented by software executed by various types of processors. For example, a module may comprise a segment of executable code constituting one or more physical or logical blocks of computer instructions that translate into an object, process, or function. Also, it is not required that the executable portions of such a module be physically located together, but rather, may comprise disparate instructions that are stored in different locations and which, when executed together, comprise the identified module and achieve the stated purpose of that module. The executable code may comprise just a single instruction or a set of multiple instructions, as well as be distributed over different code segments, or among different programs, or across several memory devices, etc. In a software, or partial software, module implementation, the software portions may be stored on one or more computer-readable and/or executable storage media that include, but are not limited to, an electronic, magnetic, optical, electromagnetic, infrared, or semiconductor-based system, apparatus, or device, or any suitable combination thereof. In general, for purposes of the present disclosure, a computer-readable and/or executable storage medium may be comprised of any tangible and/or non-transitory medium that is capable of containing and/or storing a program for use by or in connection with an instruction execution system, apparatus, processor, or device.

Similarly, for the purposes of the present disclosure, the term "component" may be comprised of any tangible, physical, and non-transitory device. For example, a component may be in the form of a hardware logic circuit that is comprised of customized VLSI circuits, gate arrays, or other integrated circuits, or is comprised of off-the-shelf semiconductors that include logic chips, transistors, or other discrete components, or any other suitable mechanical and/or electronic devices. In addition, a component could also be implemented in programmable hardware devices such as field programmable gate arrays (FPGA), programmable array logic, programmable logic devices, etc. Furthermore, a component may be comprised of one or more silicon-based integrated circuit devices, such as chips, die, die planes, and packages, or other discrete electrical devices, in an electrical communication configuration with one or more other components via electrical conductors of, for example, a printed circuit board (PCB) or the like. Accordingly, a module, as defined above, may in certain embodiments, be embodied by or implemented as a component and, in some instances, the terms module and component may be used interchangeably.

Where the term "circuit" is used herein, it includes one or more electrical and/or electronic components that constitute one or more conductive pathways that allow for electrical current to flow. A circuit may be in the form of a closed-loop configuration or an open-loop configuration. In a closed-loop configuration, the circuit components may provide a return pathway for the electrical current. By contrast, in an open-looped configuration, the circuit components therein may still be regarded as forming a circuit despite not including a return pathway for the electrical current. For example, an integrated circuit is referred to as a circuit irrespective of whether the integrated circuit is coupled to ground (as a return pathway for the electrical current) or not. In certain exemplary embodiments, a circuit may comprise a set of integrated circuits, a sole integrated circuit, or a portion of an integrated circuit. For example, a circuit may include customized VLSI circuits, gate arrays, logic circuits, and/or other forms of integrated circuits, as well as may include off-the-shelf semiconductors such as logic chips, transistors, or other discrete devices. In a further example, a circuit may comprise one or more silicon-based integrated circuit devices, such as chips, die, die planes, and packages, or other discrete electrical devices, in an electrical communication configuration with one or more other components via electrical conductors of, for example, a printed circuit board (PCB). A circuit could also be implemented as a synthesized circuit with respect to a programmable hardware device such as a field programmable gate array (FPGA), programmable array logic, and/or programmable logic devices, etc. In other exemplary embodiments, a circuit may comprise a network of non-integrated electrical and/or electronic components (with or without integrated circuit devices). Accordingly, a module, as defined above, may in certain embodiments, be embodied by or implemented as a circuit.

It will be appreciated that example embodiments that are disclosed herein may be comprised of one or more microprocessors and particular stored computer program instructions that control the one or more microprocessors to implement, in conjunction with certain non-processor circuits and other elements, some, most, or all of the functions disclosed herein. Alternatively, some or all functions could be implemented by a state machine that has no stored program instructions, or in one or more application-specific integrated circuits (ASICs) or field-programmable gate arrays (FPGAs), in which each function or some combinations of certain of the functions are implemented as custom logic. A combination of these approaches may also be used. Further, references below to a "controller" shall be defined as comprising individual circuit components, an application-specific integrated circuit (ASIC), a microcontroller with controlling software, a digital signal processor (DSP), a field programmable gate array (FPGA), and/or a processor with controlling software, or combinations thereof.

Additionally, the terms "couple," "coupled," or "couples," where may be used herein, are intended to mean either a direct or an indirect connection. Thus, if a first device couples, or is coupled to, a second device, that connection may be by way of a direct connection or through an indirect connection via other devices (or components) and connections.

Regarding, the use herein of terms such as "an embodiment," "one embodiment," an "exemplary embodiment," a "particular embodiment," or other similar terminology, these terms are intended to indicate that a specific feature, structure, function, operation, or characteristic described in connection with the embodiment is found in at least one embodiment of the present disclosure. Therefore, the appearances of phrases such as "in one embodiment," "in an embodiment," "in an exemplary embodiment," etc., may, but do not necessarily, all refer to the same embodiment, but rather, mean "one or more but not all embodiments" unless expressly specified otherwise. Further, the terms "comprising," "having," "including," and variations thereof, are used in an open-ended manner and, therefore, should be interpreted to mean "including, but not limited to . . . " unless expressly specified otherwise. Also, an element that is preceded by "comprises . . . a" does not, without more constraints, preclude the existence of additional identical elements in the subject process, method, system, article, or apparatus that includes the element.

The terms "a," "an," and "the" also refer to "one or more" unless expressly specified otherwise. By way of example, "a processor" programmed to perform various functions refers to one processor programmed to perform each and every function or more than one processor collectively programmed to perform each of the various functions. In addition, the phrase "at least one of A and B" as may be used herein and/or in the following claims, whereby A and B are variables indicating a particular object or attribute, indicates a choice of A or B, or both A and B, similar to the phrase "and/or." Where more than two variables are present in such a phrase, this phrase is hereby defined as including only one of the variables, any one of the variables, any combination (or sub-combination) of any of the variables, and all of the variables.

Further, where used herein, the term "about" or "approximately" applies to all numeric values, whether or not explicitly indicated. These terms generally refer to a range of numeric values that one of skill in the art would consider equivalent to the recited values (e.g., having the same function or result). In certain instances, these terms may include numeric values that are rounded to the nearest significant figure.

In addition, any enumerated listing of items that is set forth herein does not imply that any or all of the items listed are mutually exclusive and/or mutually inclusive of one another, unless expressly specified otherwise. Further, the term "set," as used herein, shall be interpreted to mean "one or more," and in the case of "sets," shall be interpreted to mean multiples of (or a plurality of) "one or more," "ones or more," and/or "ones or mores" according to set theory, unless expressly specified otherwise.

The foregoing detailed description has been presented for purposes of illustration and description. It is not intended to be exhaustive or be limited to the precise form disclosed. Many modifications and variations are possible in light of the above description. The described embodiments were chosen to best explain the principles of the technology and its practical application to thereby enable others skilled in the art to best utilize the technology in various embodiments and with various modifications as are suited to the particular use contemplated. The scope of the technology is defined by the claims appended hereto.

What is claimed is:

1. A method of performing an erase operation in a memory device having a memory block that includes an array of memory cells that are arranged in a plurality of word lines, the method comprising the steps of:

initiating an erase operation of the memory block;

during the erase operation, applying at least one erase pulse to the memory block to erase memory cells of a plurality of selected word lines of the plurality of word lines, the plurality of selected word lines including a plurality of selected memory cells;

responsive to a suspension event prior to completion of the erase operation, suspending the erase operation by suspending the at least one erase pulse for a suspend duration;

after the suspend duration and before applying a next erase pulse to the memory block, performing an erase-verify operation on only a first portion of the selected memory cells of the memory block;

in response to a determination that the first portion of the selected memory cells did not pass the erase-verify operation, resuming the erase operation by applying the next erase pulse to the memory block and then performing the erase-verify operation on a remaining portion of the selected memory cells of the memory block; and in response to a determination that the first portion of the selected memory cells passed the erase-verify operation, completing the erase operation without applying the next erase pulse to the memory block.

2. The method as set forth in claim 1, further including the steps of:

during the step of performing the erase-verify operation on only the first portion of the selected memory cells, counting a number of memory cells that fail the erase-verify operation to establish a count; and determining an erase pulse duration for the next erase pulse as a function of the count.

3. The method as set forth in claim 2, wherein the step of determining the erase pulse duration for the next erase pulse as a function of the count includes the steps of:

comparing the count to a predetermined threshold, setting the erase pulse duration at a first timeframe in response to the count being above the predetermined threshold, and setting the erase pulse duration at a second timeframe in response to the count being below the predetermined threshold, and wherein the second timeframe is less than the first timeframe.

4. The method as set forth in claim 3, wherein the first portion of the selected memory cells includes the memory cells of a single string of a plurality of strings in the memory block, and the remaining portion of the selected memory cells includes remaining strings of the memory block.

5. The method as set forth in claim 4, wherein in response to any of the remaining strings of the memory block failing the erase-verify operation, then the method further includes the step of setting the erase pulse duration at a third timeframe that is less than the second timeframe.

6. The method as set forth in claim 1, wherein the first portion of selected memory cells includes the memory cells of a single string of a plurality of strings in the memory block.

7. The method as set forth in claim 1, wherein the plurality of selected word lines include all data word lines in the memory block.

8. A memory device comprising:

a memory block with an array of memory cells that are arranged in a plurality of word lines, the plurality of word lines including a plurality of selected word lines containing selected memory cells to be erased;

circuitry for erasing the selected memory cells in an erase operation, wherein, during the erase operation, the circuitry is configured to;

apply at least one erase pulse to the memory block to erase the selected memory cells;

responsive to a suspension event prior to completion of the erase operation, suspend the erase operation by suspending the at least one erase pulse for a suspend duration;

after the suspend duration and before applying a next erase pulse to the memory block, perform an erase-verify operation on only a first portion of the selected memory cells of the memory block;

in response to a determination that the first portion of the selected memory cells did not pass the erase-verify operation, resume the erase operation by applying the next erase pulse to the memory block and then performing the erase-verify operation on a remaining portion of the selected memory cells of the memory block; and in response to a determination that the first portion of the selected memory cells passed the erase-verify operation, complete the erase operation without applying the next erase pulse to the memory block.

9. The memory device as set forth in claim 8, wherein:

during the step of performing the erase-verify operation on only the first portion of the selected memory cells, the circuitry counts a number of memory cells that fail the erase-verify operation to establish a count and determines an erase pulse duration for the next erase pulse as a function of the count.

10. The memory device as set forth in claim 9, wherein while determining the erase pulse duration for the next erase pulse as a function of the count, the circuitry:

compares the count to a predetermined threshold, and sets the erase pulse duration at a first timeframe in response to the count being above the predetermined threshold, and sets the erase pulse duration at a second timeframe in response to the count being below the predetermined threshold, and wherein the second timeframe is less than the first timeframe.

11. The memory device as set forth in claim 10, wherein the first portion of the selected memory cells includes the memory cells of a single string of a plurality of strings in the memory block, and the remaining portion of the selected memory cells includes remaining strings of the memory block.

12. The memory device as set forth in claim 11, wherein in response to any of the remaining strings of the memory block failing the erase-verify operation, then the circuitry sets the erase pulse duration at a third timeframe that is less than the second timeframe.

13. The memory device as set forth in claim 8, wherein the first portion of selected memory cells includes the memory cells of a single string of a plurality of strings in the memory block.

14. The memory device as set forth in claim 8, wherein the plurality of selected word lines include all data word lines in the memory block.

15. An apparatus, comprising:

a memory block with an array of memory cells that are arranged in a plurality of word lines, the plurality of word lines including a plurality of selected word lines containing selected memory cells to be erased;

erasing means for erasing the selected memory cells in an erase operation, during the erase operation, the erasing means being configured to;

apply at least one erase pulse to the memory block to erase the selected memory cells;

responsive to a suspension event prior to completion of the erase operation, suspend the erase operation by suspending the at least one erase pulse for a suspend duration;

after the suspend duration and before applying a next erase pulse to the memory block, perform an erase-verify operation on only a first portion of the selected memory cells of the memory block;

in response to a determination that the first portion of the selected memory cells did not pass the erase-verify operation, resume the erase operation by applying the next erase pulse to the memory block and then performing the erase-verify operation on a remaining portion of the selected memory cells of the memory block; and in response to a determination that the first portion of the selected memory cells passed the erase-verify operation, complete the erase operation without applying the next erase pulse to the memory block.

16. The apparatus as set forth in claim 15, wherein:

while performing the erase-verify operation on only the first portion of the selected memory cells, the erasing means counts a number of memory cells that fail the erase-verify operation to establish a count and determines an erase pulse duration for the next erase pulse as a function of the count.

17. The apparatus as set forth in claim 16, wherein while determining the erase pulse duration for the next erase pulse as a function of the count, the erasing means:

compares the count to a predetermined threshold, and sets the erase pulse duration at a first timeframe in response to the count being above the predetermined threshold, and sets the erase pulse duration at a second timeframe in response to the count being below the predetermined threshold, and wherein the second timeframe is less than the first timeframe.

18. The apparatus as set forth in claim 17, wherein the first portion of the selected memory cells includes the memory cells of a single string of a plurality of strings in the memory block, and the remaining portion of the selected memory cells includes remaining strings of the memory block.

19. The apparatus as set forth in claim 18, wherein in response to any of the remaining strings of the memory block failing the erase-verify operation, then the erasing means sets the erase pulse duration at a third timeframe that is less than the second timeframe.

20. The apparatus as set forth in claim 17, wherein the first portion of selected memory cells includes the memory cells of a single string of a plurality of strings in the memory block.

* * * * *